(12) United States Patent
Iyer et al.

(10) Patent No.: US 9,293,187 B2
(45) Date of Patent: Mar. 22, 2016

(54) METHODS AND APPARATUS FOR REFRESHING DIGITAL MEMORY CIRCUITS

(75) Inventors: Sundar Iyer, Palo Alto, CA (US); Shang-Tse Chuang, Los Altos, CA (US)

(73) Assignee: Cisco Technology, Inc., San Jose, CA (US)

( * ) Notice: Subject to any disclaimer, the term of this patent is extended or adjusted under 35 U.S.C. 154(b) by 349 days.

(21) Appl. No.: 13/245,426

(22) Filed: Sep. 26, 2011

(65) Prior Publication Data
US 2013/0080694 A1 Mar. 28, 2013

(51) Int. Cl.
*G06F 12/06* (2006.01)
*G11C 11/406* (2006.01)

(52) U.S. Cl.
CPC .... *G11C 11/40603* (2013.01); *G11C 11/40618* (2013.01)

(58) Field of Classification Search
CPC ................ G11C 11/40603; G11C 11/40618
See application file for complete search history.

(56) References Cited

U.S. PATENT DOCUMENTS

| | | | | |
|---|---|---|---|---|
| 5,193,165 A * | 3/1993 | Eikill et al. | | 711/106 |
| 5,463,755 A * | 10/1995 | Dumarot et al. | | 711/148 |
| 5,907,857 A * | 5/1999 | Biswas | | 711/106 |
| 6,154,824 A * | 11/2000 | Robertson et al. | | 711/202 |
| 6,167,484 A * | 12/2000 | Boyer et al. | | 711/106 |
| 6,415,353 B1 * | 7/2002 | Leung | | 711/106 |
| 6,526,471 B1 * | 2/2003 | Shimomura et al. | | 711/5 |
| 6,629,220 B1 * | 9/2003 | Dyer | | 711/158 |
| 7,363,406 B2 * | 4/2008 | Chai et al. | | 710/244 |
| 7,392,339 B2 * | 6/2008 | David | | 711/106 |
| 7,953,921 B2 * | 5/2011 | Walker et al. | | 711/106 |
| 8,151,044 B2 * | 4/2012 | Proesbsting | | 711/107 |
| 2003/0065884 A1 * | 4/2003 | Lu et al. | | 711/118 |
| 2005/0108460 A1 * | 5/2005 | David | | 711/5 |
| 2005/0265104 A1 * | 12/2005 | Remaklus et al. | | 365/222 |
| 2009/0116326 A1 * | 5/2009 | Lee | | 365/222 |
| 2011/0131385 A1 * | 6/2011 | Henriksson et al. | | 711/158 |

OTHER PUBLICATIONS

Stuecheli, J.; Kaseridis, D.; Hunter, H.C.; John, L.K., "Elastic Refresh: Techniques to Mitigate Refresh Penalties in High Density Memory," Microarchitecture (MICRO), 2010 43rd Annual IEEE/ACM International Symposium on , vol., No., pp. 375,384, Dec. 4-8, 2010.*
Jeffrey Stuecheli, Dimitris Kaseridis, Hillery C.Hunter, and Lizy K. John. 2010. Elastic Refresh: Techniques to Mitigate Refresh Penalties in High Density Memory. In Proceedings of the 2010 43rd Annual IEEE/ACM International Symposium on Microarchitecture (MICRO '43). IEEE Computer Society, Washington, DC, USA, 375-384.*

* cited by examiner

*Primary Examiner* — Kevin Verbrugge
*Assistant Examiner* — Ramon A Mercado

(57) ABSTRACT

Dynamic memory systems require each memory cell to be continually refreshed. During a memory refresh operation, the refreshed memory cells cannot be accessed by a memory read or write operation. In multi-bank dynamic memory systems, concurrent refresh systems allow memory refresh circuitry to refresh memory banks that are not currently involved in memory access operations. To efficiently refresh memory banks and advanced round robin refresh system refreshes memory banks in a nominal round robin manner but skips memory banks blocked by memory access operations. Skipped memory banks are prioritized and then refreshed when they are no longer blocked.

21 Claims, 13 Drawing Sheets

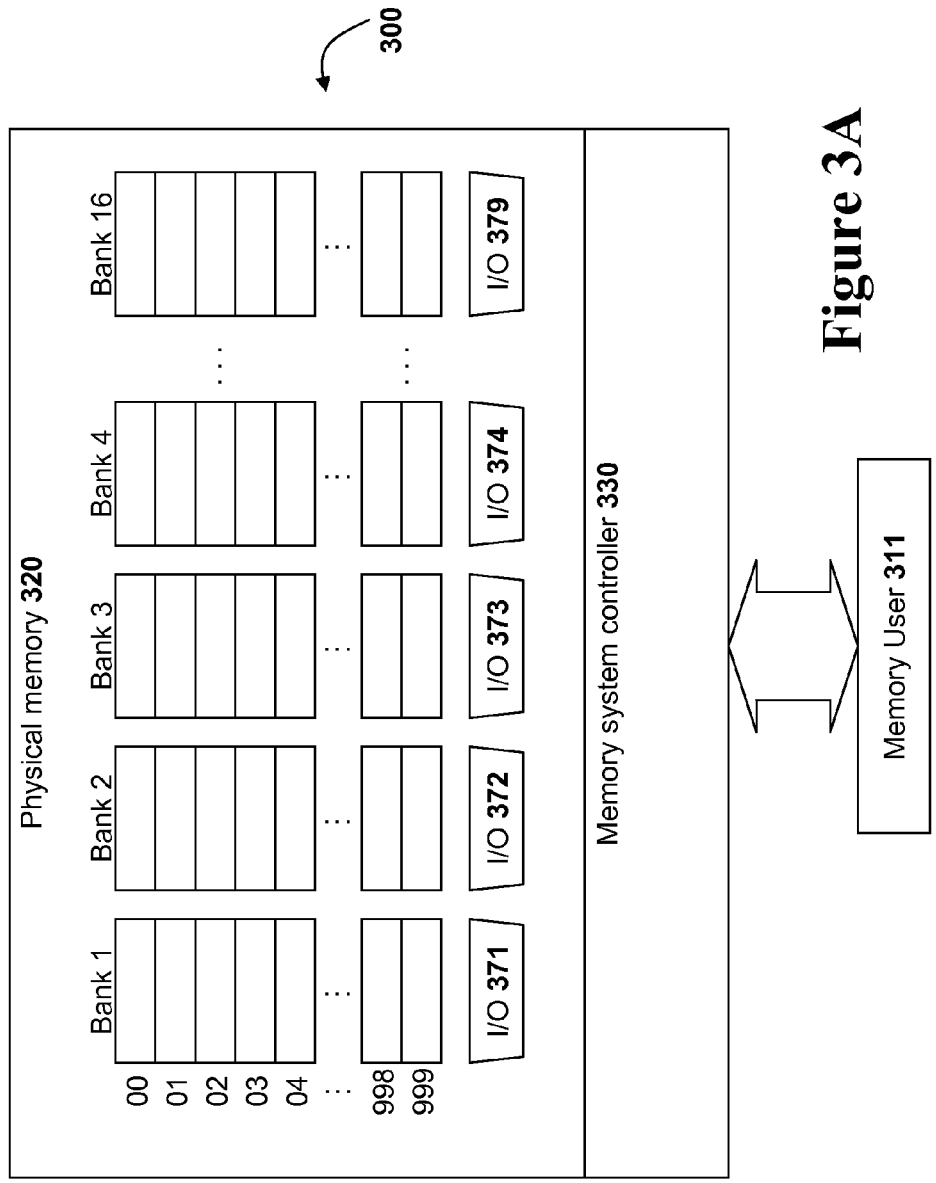

METHODS AND APPARATUS FOR REFRESHING DIGITAL MEMORY CIRCUITS

TECHNICAL FIELD

The present invention relates to the field of digital memory circuits. In particular, but not by way of limitation, the present invention discloses techniques for designing and constructing memory refresh circuitry for dynamic random access memory circuits.

BACKGROUND

Traditionally, the dynamic random access memory (DRAM) chips used in a personal computer system are manufactured using a different semiconductor process technology than the semiconductor process technology used to manufacturer the processor for the personal computer system. The process technology for creating large high-density memory circuits required additional steps not used in a traditional CMOS process for creating digital semiconductor devices. Thus, in most personal computer systems, the processor is implemented on one chip and the main memory is implemented on other chips. The personal computer system is constructed by coupling together the processor chip, the DRAM chips, and a few other support chips on a printed circuit board.

The main memory technology available within CMOS digital circuits has been static random access memory (SRAM). SRAM technology provides very good performance but SRAM has a low bit density (amount of bits per unit of area) and consumes a relatively large amount of power. However, in recent years, embedded dynamic random access memory (eDRAM) circuitry that is constructed using the industry standard CMOS fabrication processes has become available. Embedded DRAM (eDRAM) has become a popular technology for use within Application Specific Integrated Circuits (ASICs) since eDRAM allows an entire computer system (both the processor and the main memory) to be implemented within a single integrated circuit.

eDRAM (and traditional DRAM) is constructed as an array of individual memory cells. Each memory cell uses a capacitor to stores an electrical charge value that represents a data bit. However, since capacitors leak electrical charge over time, the charge on the capacitor must be periodically refreshed or else the memory cell will lose the stored data value. Thus, every DRAM device requires memory refresh circuitry that periodically scans through the array of memory cells and refreshes the electrical charge stored on the capacitor within every memory cell. When a memory cell is being refreshed, that particular memory cell cannot be accessed by other circuitry for reading and writing to the memory cell. Thus, memory refresh circuitry uses valuable memory bandwidth. Therefore, it is desirable to have memory refresh circuitry that efficiently refreshes memory cells without unnecessarily using up too many resources such as available memory cycles.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

FIG. 3A illustrates a block diagram of dynamic memory system that contains 16 individual memory banks that each have individual input/output (I/O) driver circuits.

DETAILED DESCRIPTION

The following detailed description includes references to the accompanying drawings, which form a part of the detailed description. The drawings show illustrations in accordance with example embodiments. These embodiments, which are also referred to herein as "examples," are described in enough detail to enable those skilled in the art to practice the invention. It will be apparent to one skilled in the art that specific details in the example embodiments are not required in order to practice the present invention. For example, although some of the example embodiments are disclosed with reference to computer processing systems used for packet-switched networks, the teachings can be used in many other environments. Thus, any digital system that uses digital memory can benefit from the teachings of the present disclosure. The example embodiments may be combined, other embodiments may be utilized, or structural, logical and electrical changes may be made without departing from the scope of what is claimed. The following detailed description is, therefore, not to be taken in a limiting sense, and the scope is defined by the appended claims and their equivalents.

In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

Computer Systems

Figure 1:
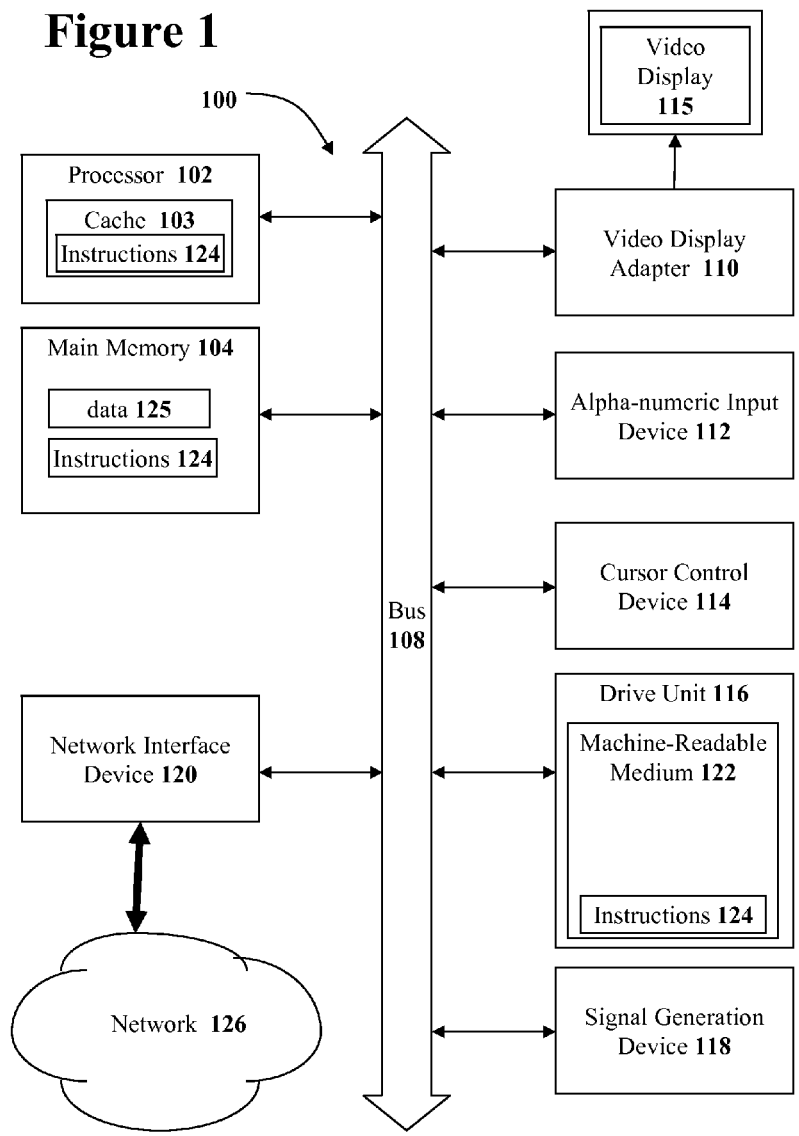
FIG. 1 illustrates a computer system within which a set of instructions, for causing the machine to perform any one or more of the methodologies discussed herein, may be executed.

The present disclosure concerns digital computer systems. FIG. 1 illustrates a diagrammatic representation of a machine in the example form of a computer system 100 that may be used to implement portions of the present disclosure. Within computer system 100 of FIG. 1, there are a set of instructions 124 that may be executed for causing the machine to perform any one or more of the methodologies discussed within this document. Furthermore, while only a single computer is illustrated, the term "computer" shall also be taken to include any collection of machines that individually or jointly execute a set (or multiple sets) of instructions to perform any one or more of the methodologies discussed herein.

The example computer system 100 of FIG. 1 includes a processor 102 (e.g., a central processing unit (CPU), a graphics processing unit (GPU) or both) and a main memory 104 and a static memory 106, which communicate with each other via a bus 108. The computer system 100 may further include a video display adapter 110 that drives a video display system 115 such as a Liquid Crystal Display (LCD). The computer system 100 also includes an alphanumeric input device 112 (e.g., a keyboard), a cursor control device 114 (e.g., a mouse or trackball), a disk drive unit 116, a signal generation device 118 (e.g., a speaker) and a network interface device 120. Note that not all of these parts illustrated in FIG. 1 will be present in all embodiments. For example, a computer server system may not have a video display adapter 110 or video display system 115 if that server is controlled through the network interface device 120.

The disk drive unit 116 includes a machine-readable medium 122 on which is stored one or more sets of computer instructions and data structures (e.g., instructions 124 also known as 'software') embodying or utilized by any one or more of the methodologies or functions described herein. The instructions 124 may also reside, completely or at least partially, within the main memory 104 and/or within a cache memory 103 associated with the processor 102. The main memory 104 and the cache memory 103 associated with the processor 102 also constitute machine-readable media.

The instructions 124 may further be transmitted or received over a computer network 126 via the network interface device 120. Such transmissions may occur utilizing any one of a number of well-known transfer protocols such as the well known File Transport Protocol (FTP). While the machine-readable medium 122 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies described herein, or that is capable of storing, encoding or carrying data structures utilized by or associated with such a set of instructions. The term "machine-readable medium" shall accordingly be taken to include, but not be limited to, solid-state memories, optical media, and magnetic media.

For the purposes of this specification, the term "module" includes an identifiable portion of code, computational or executable instructions, data, or computational object to achieve a particular function, operation, processing, or procedure. A module need not be implemented in software; a module may be implemented in software, hardware/circuitry, or a combination of software and hardware.

Dynamic Random Access Memory Overview

A dynamic random access memory (DRAM) is a type of semiconductor memory circuit that stores each data bit in a small simple memory cell circuit that generally consists of a transistor and a capacitor. The capacitor in the memory cell can be either in a charged or discharged state and these two different states are taken to represent the two different possible values of a data bit (0 or 1).

Since each memory cell in a DRAM device is very small (only one transistor and one capacitor are required for each memory cell), this allows DRAM devices to achieve very high memory density values (bits stored per unit area). Traditionally, DRAM has been manufactured with specialized semiconductor fabrication processes designed specifically for maximizing high memory densities. However, DRAM is now also manufactured with the industry standard CMOS fabrication processes such that DRAM circuitry can be embedded within traditional digital semiconductor devices such as computer processors. Such DRAM circuits manufactured within CMOS digital circuits are generally referred to as embedded DRAM (eDRAM).

The elegant simplicity of DRAM memory cells also creates a critical vulnerability. Specifically, the electrical charge placed on the cell's capacitor to store a data state in a memory cell leaks over time such that the memory cell will lose the stored data representation if the charge stored on the memory cell's capacitor is not continually refreshed on a regular basis. Thus, there is a stringent memory refresh requirement for dynamic memory cells. Specifically, each memory cell within a dynamic memory array must be refreshed within a time period referred to as the cell retention time period. (In the literature on memory devices, the cell retention time period is often referred to as $t_{REF}$, the maximum time allowable between successive refresh operations.)

To handle the refresh requirement of dynamic memory cells, dynamic memory systems require memory refresh circuitry that continually scans through the entire array of memory cells to ensure that the charge in every memory cell is regularly refreshed well within the cell retention time period needed. If a dynamic memory cell is not refreshed within the cell retention time period then the data stored in that memory cell may have be lost.

Figure 2:
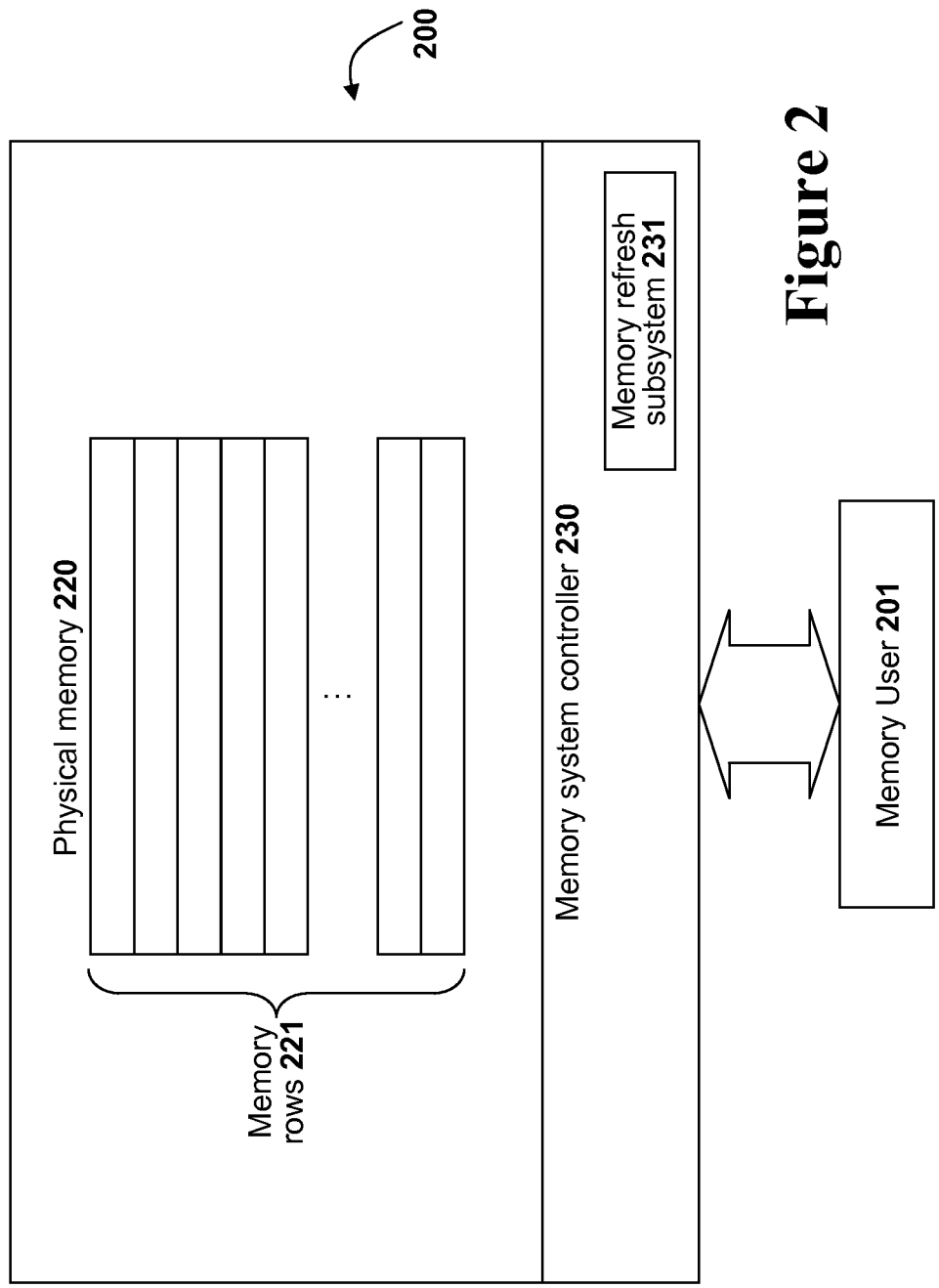
FIG. 2 illustrates a block diagram of a dynamic memory system.

FIG. 2 illustrates a high level block diagram of a dynamic memory system 200 that is used by a memory user 201. The memory user 201 may be any other digital circuitry that needs memory services such as a processor, a DSP, etc. A memory system controller 230 for the dynamic memory system 200 receives memory access requests (memory read and write requests) from memory user 201 and responds to those memory access requests by accessing the physical memory bank 220. The physical memory bank array 220 is generally organized into columns (not show) and rows 221.

In addition to handling memory access requests, the dynamic memory system controller 230 also includes a memory refresh subsystem 231 that is responsible for ensuring that every memory cell in the physical memory bank 220 is periodically refreshed. A memory refresh operation is basically the same as reading the data out of a memory cell and then writing that data back into the memory cell. Thus, the memory refresh subsystem 231 uses much of the same circuitry that is used when reading from or writing to the physical memory array 220. Therefore, memory refresh operations block normal memory access operations from occurring at the same time (and vice versa).

A typical memory refresh system operates by refreshing an entire memory row from a memory bank at a time. For most of this document, it is assumed that a memory row can be refreshed in a single memory cycle. Thus, if there are R memory rows in a physical memory bank, then R refresh cycles must occur within the number of operating cycles available during the specified cell retention time period. If W operating cycles take place during the specified cell retention time period then this may be put formally as:

$R_{1bank}$ refresh cycles must occur during every W operating cycles

For example, a particular memory cell design may require the memory cell to be refreshed every 50 microseconds in order to reliably store the data that has been written into the memory cell. The 50 microsecond cell retention time period is the maximum amount of time that can elapse between successive refresh operations for any memory cell before that memory cell may lose its capacitor charge (and therefore lose its data). If there are 1000 rows of memory cells in a memory bank and a refresh operation can refresh every memory cell in a row simultaneously then there needs to be an average of one row memory refreshed every 50 nanoseconds. Note that the refresh operations do not need to be performed on regular schedule of one memory row refreshed every 50 nanoseconds, but every memory cell must be refreshed at least every 50 microseconds to prevent data loss.

If a particular memory system operates with an external clock rate of 500 Megahertz and that memory system is capable of handling a memory operation every clock cycle, then the memory cells in that memory system can be accessed every 2 nanoseconds. During the 50 microsecond cell retention time period, there will be 25,000 operating cycles available for the 500 Megahertz memory. If 1000 memory rows need to be refreshed then 1000 of the 25,000 available operating cycles during each 50 microsecond cell retention time period must be reserved for memory refresh operations or else the memory cells in memory system may begin to lose data.

Many embedded DRAM (eDRAM) circuits handle memory refresh operations internally with their own internal refresh systems (such as the memory refresh subsystem 231 illustrated in the dynamic memory system 200 of FIG. 2). Such memory systems handle the task of ensuring that every memory cell is refreshed within the memory cell retention time period such that memory users do not need to worry about memory refresh operations. However, these internal memory refresh circuits may still need memory users to allow for a certain number of the memory operating cycles to be dedicated as refresh cycles where read and write operations cannot be handled. Thus, an eDRAM memory system may require a specified number of reserved 'refresh' clock cycles during the maximum specified memory cell data loss time wherein no read or write operations may be issued to the memory system.

For example, using the example presented earlier, the eDRAM system may need to have a memory user allow at least 1000 reserved refresh clock cycles every 50 microseconds (or every 25,000 operating cycles). During the reserved refresh clock cycles the memory user does not issue any read or write requests such that the internal refresh circuitry of the eDRAM may use those reserved refresh clock cycles to refresh the rows of memory cells. These reserved refresh clock cycles use up valuable resources. For example, when 1000 reserved refresh clock cycles are required out of 25,000 operating cycles during the memory cell retention time period then 4% of the operating cycles are not available for memory access operations since those reserved refresh clock cycles must be used for refreshing the memory cells. Thus, the bandwidth available for read or write memory operations is reduced.

In many dynamic memory systems, the dynamic memory refresh circuitry operates by refreshing the rows of the memory system on a regular periodic refresh schedule. In such a system, the refresh operation has priority over any other memory access operation in order to prevent data loss. Thus, when the memory system has both a memory refresh operation and a memory access operation directed at a memory bank, the memory access operation will be stalled such that the refresh operation can be immediately handled to ensure no loss of data. After the handling the refresh operation, the memory system will then handle the stalled memory access operation. With such a memory system, the memory system does not guarantee an immediate response to a memory request since the memory access operation may be stalled. Although this is acceptable in many situations, certain applications require a guaranteed immediate response such that other solutions to the memory refresh are needed.

Shared Circuits in Memory Systems

Figure 3B:
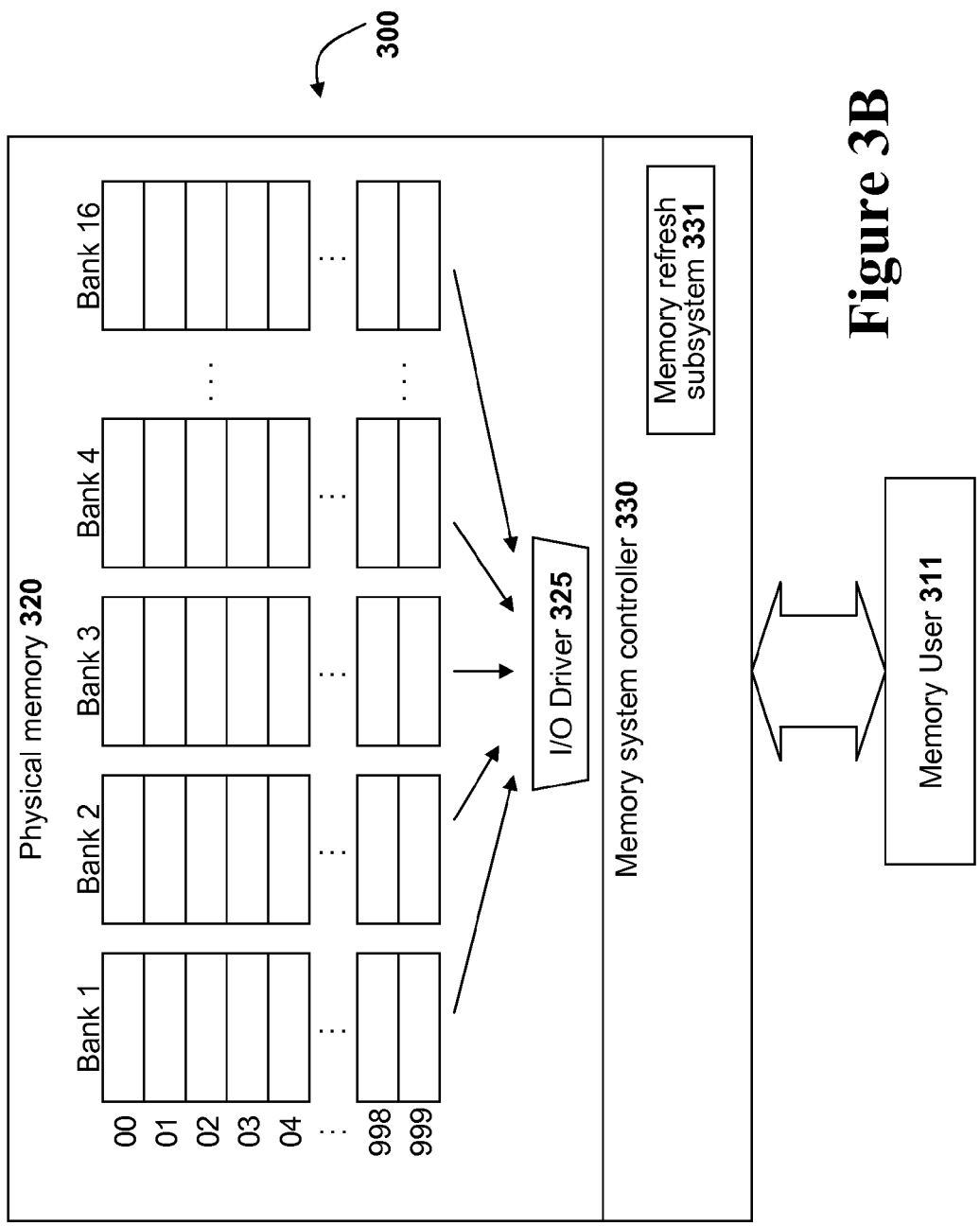
FIG. 3B illustrates the dynamic memory system of FIG. 3A wherein all 16 individual memory banks share a single input/output (I/O) driver circuit.

FIG. 3A illustrates an example of embedded dynamic memory system 300 that contains 16 individual memory banks (memory banks 1 to 16) that each have their own individual input/output (I/O) driver circuits. To improve upon memory density, a memory system may reduce the number of instances of a particular type of circuit and instead share a smaller number of that type of circuit. For example, FIG. 3B illustrates a similar dynamic memory system 300 that contains 16 individual memory banks (memory banks 1 to 16) except that all of the memory banks share a single input/output (I/O) driver circuit 325. If the data read from the dynamic memory system 300 does not need to be wider than the width of the rows in the memory banks, then sharing a single input/output (I/O) driver circuit 325 significantly reduces the area needed to implement the dynamic memory system 300.

Similarly, instead of having individual refresh circuitry for each memory bank, a single instance of refresh circuitry 331 illustrated in FIG. 3B may be shared across the memory 16 banks. That single instance of refresh circuitry 331 may only refresh a single row of a single memory bank at a time. However, if the memory refresh circuitry 331 is shared such that only one of the sixteen memory banks can refresh one of its rows at a time then the dynamic memory system 300 will require 16,000 refresh memory cycles to refresh every row of every memory bank. For 500 Megahertz rated memory with a 50 microsecond memory cell data retention period that would mean that 16,000 of the 25,000 available operating cycles during the 50 microsecond cell retention time would be needed to for refreshing the memory cells. A memory system that uses 64% of the available operating cycles to refresh memory cells is clearly a wasteful solution that is using up many resources just for refreshing the memory.

To prevent refresh operations from using such a large proportion of the available operating cycles for a multi-bank memory system, the multi-bank memory systems may use 'dual concurrent refresh'. Dual concurrent refresh allows for a memory access operation to occur simultaneously with a refresh operation as long as the memory access and refresh operations are directed toward different memory banks in the multi-bank memory system. Thus, the memory refresh circuitry 331 can refresh a memory row of a memory bank while a concurrent memory access operation (read or write) is occurring in another memory bank of a multi-bank memory system. In this manner, most memory rows in a multi-bank memory system are available to be refreshed while another memory bank is being accessed to handle a memory access operation. Therefore, in a multi-bank memory system with dual concurrent refresh, the memory refresh operations do not consume most of the available operating cycles since most memory refreshing is performed concurrently with memory access (read or write) operations.

However, certain memory access patterns may still cause problems in memory system with dual concurrent refresh capability. For example, if a memory user continuously accesses one specific memory bank in a multi-bank memory system such that the memory refresh circuitry cannot access that memory bank for a significant period of time then the memory cells in that continually accessed memory bank would eventually lose data. Therefore, even with a dual concurrent refresh system a memory refresh system will require a certain number of reserved refresh cycles wherein memory access are not allowed to occur. During a reserved refresh cycle, the memory user does not issue a memory request such that the refresh circuitry in the memory system can use that cycle to refresh a memory row without any constraint from memory accesses. In this manner, the refresh circuitry would have an opportunity to refresh rows in a memory bank that is continually being accessed by a memory user. The reserved refresh cycle requirements can be formally specified as:

$R_{Nbank}$ refresh cycles must occur during every W operating cycles

For memory systems with dual concurrent refresh, most memory rows will be refreshed while other memory access operations are occurring concurrently. But a small number of reserved refresh cycles are still required to prevent worst case memory access patterns from blocking memory rows from being refreshed as necessary. In a single memory bank system (with no concurrent refresh possible), it was relatively easy to determine the number of reserved refresh cycles the must occur since the refresh system was continually attempting to refresh rows in that one single memory bank. However, in a multiple bank memory with dual concurrent refresh, the memory refresh strategy used to select which memory bank and which memory row should be refreshed next will affect how many reserved refresh cycles are needed.

Oldest Non-Blocked Row Refresh System

In an optimal dynamic memory refresh system, the refresh circuitry would consider the time since the last memory refresh for each and every memory row in the dynamic memory system. The refresh system would then refresh the memory row that has least recently been refreshed. (The memory row having the time since the last memory refresh that is closest to the memory cell retention time period and thus is closest to losing its data.) Such an optimal refresh system would only require an optimized minimum number of refresh cycles since the refresh circuitry would always be refreshing the memory row that most needs to be refreshed.

The minimum number of reserved refresh cycles needed in memory system with such an optimal refresh system has been mathematically determined. Specifically, in a multi-bank memory system with B independent memory banks, R rows in each memory bank, and W operating cycles in each memory cell retention period it was determined that a minimum of R reserved cycles are required in every W–(B–1)R consecutive memory cycles in order to ensure that every memory cell is refreshed within the memory cell retention time.

However, it is difficult to construct such an optimal oldest non-blocked row first refresh system in practice. Such an optimal refresh system would need to store state information (the time when each row was last refreshed) for every memory row in every memory bank of the memory system. Thus, such an optimal memory refresh system would require its own large internal memory to maintain the time-since-last-refresh state data for every memory row. Furthermore, the memory refresh system would also need logic for quickly identifying the memory row that currently has the largest amount of time passed since its most recent refresh operation. These complexities render such an optimal memory refresh system very difficult to implement such that more practical refresh methods would be desirable.

Advanced Round Robin Refresh

As set forth previously, a multi-bank memory system with dual concurrent refresh capability must refresh every memory row in the memory system within the specified memory cell retention time period. The memory refresh circuitry can access any memory bank that is not currently involved in a memory read or memory write operation. Given these requirements, the designer of memory refresh circuitry needs to implement a refresh strategy that will ensure that no data is lost and minimizes the number of reserved refresh clock cycles. The present document proposes an advanced round robin memory refresh system that generally rotates through all the memory banks in a round robin fashion but prioritizes any memory banks that had to be temporarily skipped during a round due to a conflict with a memory read or write operation. The operation of an implementation of an advanced round robin system is disclosed with reference to FIGS. 4 and 5.

Figure 4:
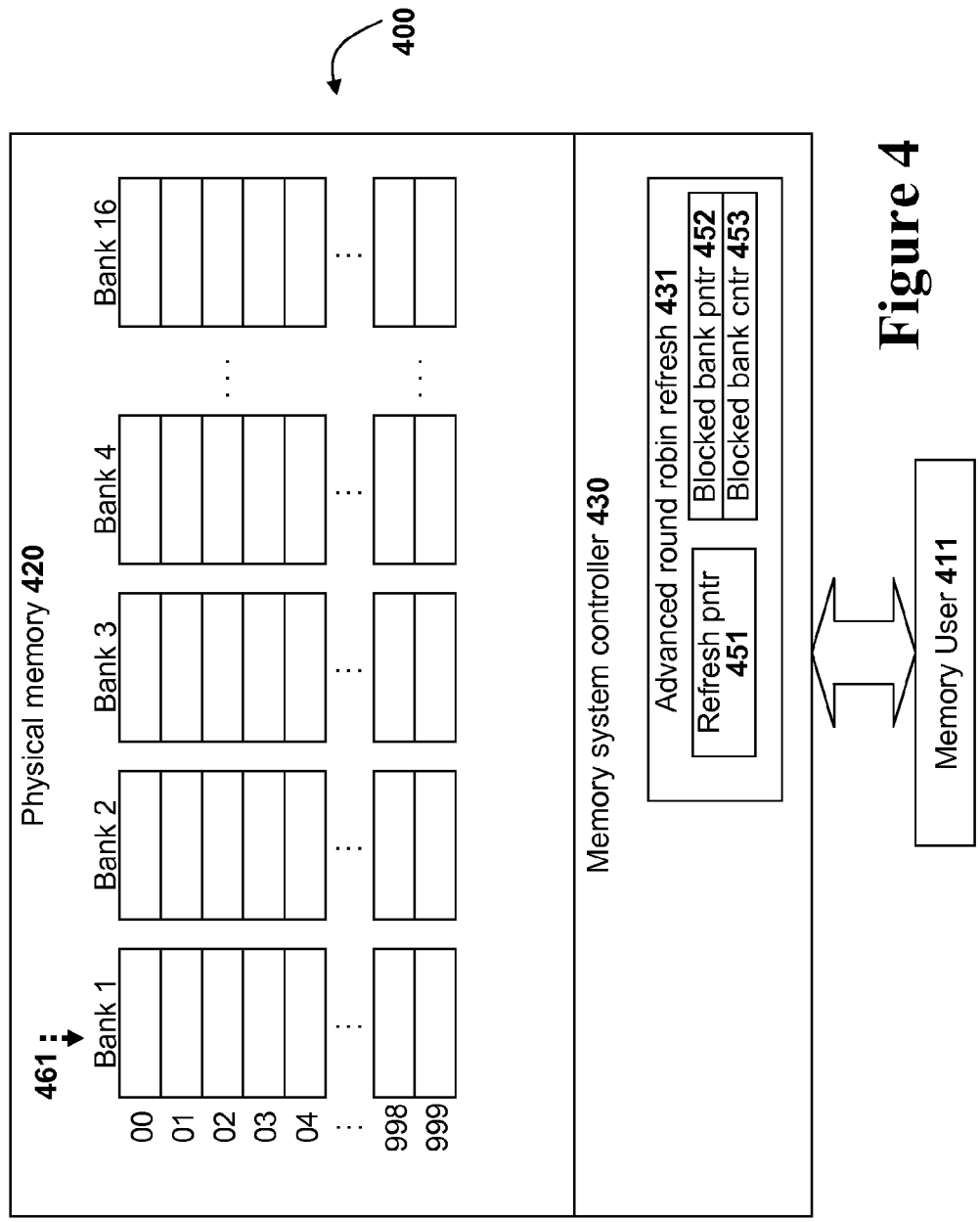
FIG. 4 illustrates a block diagram of a dynamic memory system with dual concurrent refresh that uses an advanced round robin refresh system.

Referring to FIG. 4, the advanced round robin refresh system 431 operates using a refresh pointer 451, a blocked bank pointer 452, and a blocked bank counter 453. The refresh pointer 451 points to the next memory bank that the advanced round robin refresh system 431 plans on refreshing in a round-robin rotation manner. The blocked bank pointer 452 points to memory bank has been skipped during a round of refreshing due to conflict with a read or write operation. And the blocked bank counter 453 stores how many times the bank identified in the blocked bank pointer 452 has been skipped (minus any subsequent refresh operations). Note that if the blocked bank counter 452 is zero then no memory bank is 'behind' on the refresh schedule (and thus the current value in the blocked bank pointer is invalid).

For each individual memory bank, the advanced round robin refresh system 431 also maintains a row counter (not shown) that specifies which memory row of that memory bank will be updated next. The row counter for each memory bank operates in a normal round robin manner to have the memory refresh system circularly refresh through all the memory rows of the memory bank. Thus, there are nested round-robin loops: a main round-robin through the memory banks and round-robins within each memory bank.

Figure 5:
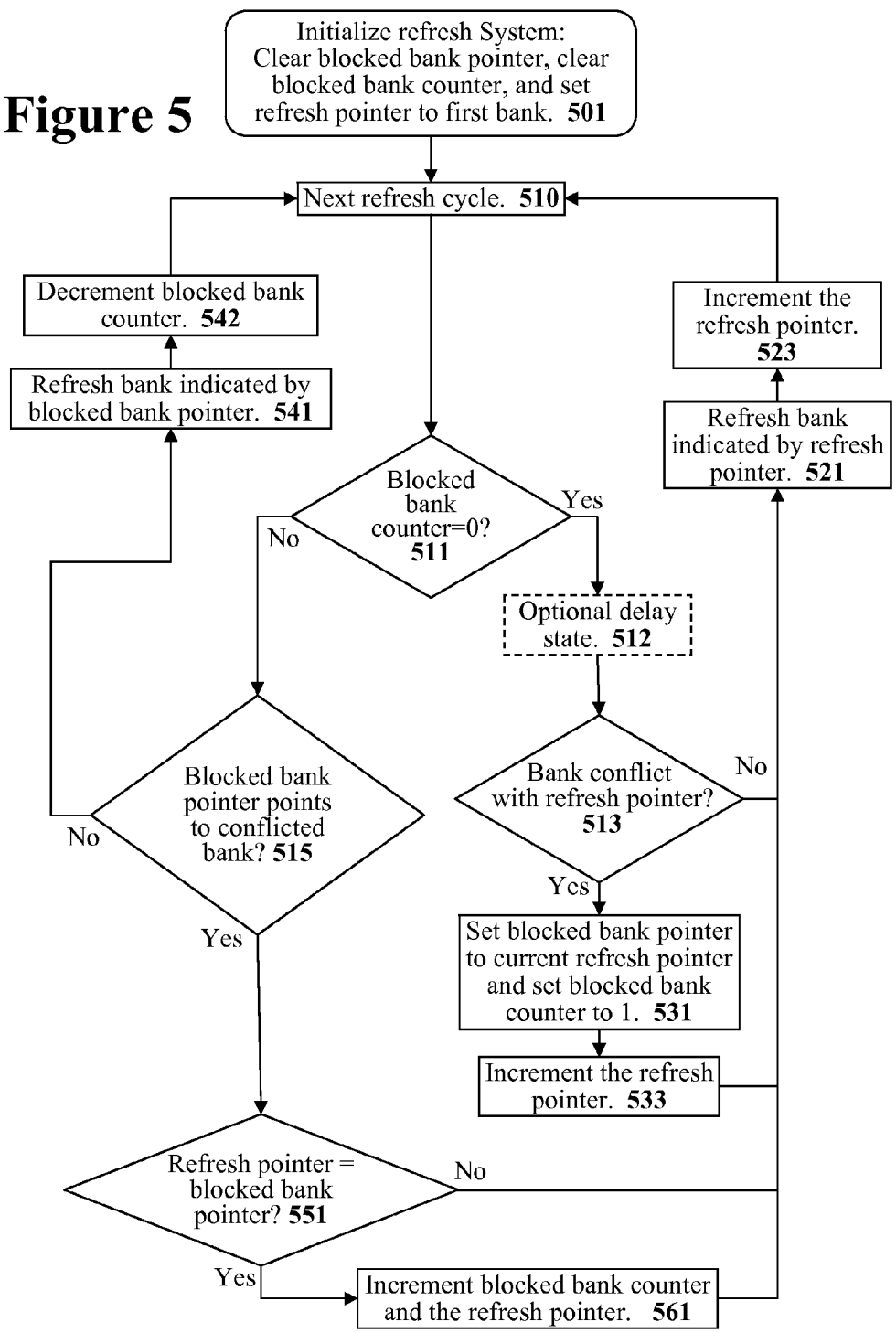
FIG. 5 illustrates a flow diagram describing the operation of an advanced round robin refresh system for a dynamic memory system.

FIG. 5 illustrates a flow diagram that describes how one embodiment the advanced round robin refresh system 431 operates. Note that not all implementations will include these steps and some steps may be done in different orders in different implementations. FIG. 5 illustrates just one possible implementation of the general system.

When the memory system first receives power, the advanced round robin refresh system 431 initializes itself at stage 501. The advanced round robin refresh system 431 clears the blocked bank pointer 452 and a blocked bank counter 453 since no banks are blocked initially. The advanced round robin refresh system 431 sets the refresh pointer 451 to a first memory bank (such as bank 1) to be refreshed. The advanced round robin refresh system 431 then advances through stage 510 to the next memory cycle.

At the start of each memory cycle, the advanced round robin refresh system 431 first determines if there is a memory bank that had been skipped during an earlier round of the refresh cycle by testing if the blocked bank counter 453 is zero at stage 511. If the blocked bank counter 453 is zero (meaning no skipped bank) then the advanced round robin refresh system 431 can proceed to stage 513 to attempt a normal refresh of the memory bank pointed to by the refresh pointer 451. (The optional delay state 512 will be described later.)

The first step when attempting a normal round robin refresh is to see if there is a memory bank conflict with a memory read or write operation. Specifically, at stage 513, the advanced round robin refresh system 431 determines if there is a current memory access (read or write) to the memory bank pointed to by the refresh pointer 451. The disclosed system gives priority to memory access operations. If there is no conflict, then the memory refresh system can refresh the memory bank pointed to by the refresh pointer 451 at stage 521, increment the refresh pointer 451 at stage 523, and proceed to the next memory cycle as stated in stage 510. The loop through stages 510, 511, 513, 521, and 523 is the normal round robin cycle that will occur as long as there are not memory bank conflicts.

Eventually, a user of the memory system and the advanced round robin refresh system 431 will attempt to access the same memory bank that the advanced round robin refresh system 431 is attempting to refresh such that a memory bank conflict occurs. Referring back to stage 513, when the advanced round robin refresh system 431 encounters the first memory bank conflict with a memory access (or any subsequent bank conflict when there is no memory bank behind on its refresh schedule), the advanced round robin refresh system 431 proceeds from stage 513 to stage 531. At stage 531, the advanced round robin refresh system 431 sets the blocked bank pointer 452 to the current value of the refresh pointer to indicate which memory bank has been blocked from a refresh. The advanced round robin refresh system 431 also sets the blocked bank counter 453 to 1 since this is the first time the blocked memory bank is being skipped. The advanced round robin refresh system 431 can then increment the refresh pointer 451 at stage 533 and proceed to refresh the next memory bank instead of the blocked memory bank. Specifically, the memory refresh system refreshes the memory bank pointed to by the refresh pointer 451 at stage 521, increments the refresh pointer 451 again at stage 523, and proceeds to the next memory cycle as stated in stage 510.

Referring back to stage 511, the first step of each refresh cycle is to determine if there is a memory bank that has been blocked from a refresh cycle such that it is 'behind' in its normal refresh schedule. This may be done by testing the blocked bank counter 453 at stage 511. If there is blocked memory bank that had a refresh skipped then the advanced round robin refresh system 431 advances to stage 515 to determine if that memory bank that was skipped earlier is still blocked by a memory access. If that memory bank is no longer blocked then the advanced round robin refresh system 431 proceeds to stage 541 to refresh that memory bank that had been skipped in an earlier round using the blocked bank pointer 452. The advanced round robin refresh system 431 then decrements the blocked bank counter 453 at stage 542 and proceeds to stage 510 to handle the next refresh cycle.

Referring back to stage 515, if the skipped memory bank is still blocked then the advanced round robin refresh system 431 proceeds to stage 551 to refresh the next memory bank in the round-robin schedule as indicated by the refresh pointer 451. However, at stage 551, the advanced round robin refresh system 431 first tests to see if the refresh pointer 451 equals the blocked bank pointer 452. If the two values are not equal then the advanced round robin refresh system 431 can proceed with a normal refresh cycle. Specifically, the advanced round robin refresh system 431 proceeds to refresh the memory bank pointed to by the refresh pointer 451 at stage 521, increment the refresh pointer 451 at stage 523, and proceeds to the next refresh cycle at stage 510.

Referring back to stage 551, if the refresh pointer 451 equals the blocked bank pointer 452 then the advanced round robin refresh system 431 has proceeded through an entire refresh round of all the memory banks and the blocked memory bank continues to be blocked. In such a case, the advanced round robin refresh system 431 proceeds to stage 561 where it will increment the blocked bank counter 453 to indicate that the blocked memory bank has been skipped again for another refresh round and thus is further behind schedule. The advanced round robin refresh system 431 then increments the refresh pointer so that it can then refresh the next memory bank at stage 521, increment the refresh pointer 451 at stage 523, and proceed to the next refresh cycle at stage 510.

In some implementations, the advanced round robin refresh system 431 may include a test at stage 561 that tests to see if the blocked bank counter 453 has exceeded a threshold number of skipped refresh opportunities. If the refresh system has been blocked beyond the threshold number then may data have been lost such that an error signal can be driven. However, such a test circuitry is not necessary since this situation will only occur if the memory user is not providing the specified minimum number of refresh cycles that allow the advanced round robin refresh system 431 to handle the worst case traffic pattern scenarios. Such circuitry would merely use up valuable layout area and only be activated when the memory user circuitry was implemented improperly.

Required Refresh Cycles

In a memory system with the advanced round robin refresh system as disclosed in FIGS. 4 and 5, a memory user accesses a memory bank in the memory system while the advanced round robin refresh system 431 efficiently refreshes another memory bank of the memory system simultaneously. The memory user has priority over the refresh circuitry such that the memory request from a memory user is not stalled. Thus, the memory refresh system works around the by memory access by refreshing memory rows in other memory banks However, certain memory access patterns by a memory user could potentially block the advanced round robin refresh system 431 from easily completing the duty of refreshing every memory cell in the memory system within the cell retention time period. For example, if a memory user continuously accesses the same memory bank then the refresh system would not be able to access that continuously accessed memory bank. Thus, the memory system will still require a specified number of reserved refresh cycles during each cell retention time period in order to refresh the rows of that continuously accessed memory bank.

The minimum number of reserved refresh cycles that will be required is dependent upon several parameters of the memory system. Specifically, the number of reserved refresh cycles will be a function of a number of memory banks B in the memory system, a number of rows R in each memory bank, and the total number of memory cycles W that occur during each cell retention time period. The required minimum number of reserved refresh cycles can be expressed as X reserved refresh cycles in every Y continuous memory cycles. The value Y represents a sliding window of Y contiguous memory cycle. X is the minimum number of reserved refresh cycles that the memory user make available in every Y memory cycle window. Using mathematical proofs, a minimum ratio of total memory cycles (Y) in a window to required reserved refresh cycles (X) has been determined. Specifically, in a system with the following assumptions:

1) A pattern of having X reserved refresh cycles in every Y memory cycles.
2) $1 \leq X \leq R$ and $R = aX + b$, where $0 \leq b \leq X - 1$
3) $W \leq 2BR$ Then a memory access pattern that has the following total-cycles to reserved-refresh cycles ratio (Y/X) will ensure that every row in every memory bank will be refreshed within the memory cell retention time period:

$$(i) \text{ If } b = 0 \text{ then } \frac{Y}{X} \leq \frac{W - (B-1)X - R}{R}$$

$$(i) \text{ If } b > 0 \text{ then } \frac{Y}{X} \leq \frac{W - Bb + X - R}{(a+1)X}$$

As long as the memory user includes reserved refresh cycles that comply with the above ratio, the advanced round robin refresh system will always refresh all of the rows in the memory system such that no data is lost. Note that there are no stalls caused by conflicts with the refresh system such that the memory system will always guarantee an immediate response to a memory request.

Assuming that the number of memory cycles W during each cell retention time period is large enough to allow all of the rows of a particular memory system to be refreshed, a designer may calculate the needed sliding window size Y that is needed for a given reserved refresh cycle value X using the following formula:

$$Y = \begin{cases} W - (B-1)R - \left\lceil \frac{W}{B} \right\rceil + X & \text{if } RB \leq W \leq (R+X)B \\ \left\lfloor \frac{W - bB - 1}{a+1} \right\rfloor & \text{if } W > (R+X)B \end{cases}$$

Note that in this document $\lfloor x \rfloor$ and $\lceil x \rceil$ denote the floor and ceiling functions respectively.

Reducing Refresh Cycles

In the advanced round robin refresh system as disclosed in FIGS. 4 and 5, the advanced round robin refresh system 431 may refresh a memory row during every memory cycle. However, depending on the memory cell retention time period, the clock rate, the number of memory banks, and the number of rows in each memory bank; refreshing a row every memory cycle may end up refreshing the rows of the memory system far more frequently than the rows actually need to be refreshed. Refreshing the memory rows more frequently than necessary will only slightly reduce the chance of losing data and may have undesirable side effects. Specifically, refreshing the memory rows more than necessary causes the memory system to consume more power than necessary and generates more heat that must be dissipated by the integrated circuit device. Thus, various methods of controlling the refresh system may be introduced to improve energy efficiency of the memory system.

One method of adjusting the refresh system is to invoke the memory refresh system less frequently than every cycle. For example, the refresh system may be invoked every 2 memory cycles, every 3 memory cycles, or some other schedule that ensures adequate refreshing of memory rows but without unnecessary energy usage.

In another implementation, the memory refresh system may be adaptive. The refresh system may operate in one mode during normal operations but in another mode when the electronic device that the integrated circuit is used within is in a 'sleep' mode. For example, a portable consumer electronics device that is not currently being used may need to keep data stored but use a minimal amount of energy when the user is not using the device. In such situation, there may be no memory users making memory requests such that refresh system may enter a low-power state wherein memory refresh operations are issued at a minimal rate. In such a state, the refresh system may not have to handle both refresh and memory access operations simultaneously such that the refresh system.

In some embodiments, the refresh schedule may be determined using a function of the number of banks B in the memory system, the number of rows R in each memory bank, and the number of operating cycles W during the memory cell retention time period. In this manner, the optimal refresh schedule may be determined based upon the specific size and speed parameters of the specific memory system.

In some embodiments, the refresh system may adjust its operation depending on the number of conflicts between the memory user and the refresh system. When there are no conflicts between the memory user and the refresh system then the refresh system will not 'fall behind' on its refresh schedule such that a slower refresh rate is possible. However, when a large number of conflicts between the memory user and the refresh system occur, the refresh system may fall behind on its refresh schedule such that the refresh system will need to 'catch up' on refresh operations for memory banks that were skipped due to a memory conflict. One possible implementation of a self-adjusting system is illustrated in the flow diagram of FIG. 5.

Referring to stage 511, at the beginning of each potential refresh cycle the refresh system tests the blocked bank counter to see if there are any memory banks that are behind on their refresh schedule. If the blocked bank counter is not zero (thus indicating that a memory banks is behind on its refresh schedule) then the refresh system proceeds to stage 515 where the refresh system attempts to refresh the skipped memory bank. But when the blocked bank counter is zero (indicating that the refresh system is on its normal refresh schedule) then the refresh system may enter a delay stage 512 where the refresh system may delay the next refresh operation. During the delay stage, the refresh system may allow one or more operating cycles to pass such that extra energy-wasting refresh operations are not performed. Thus, with the delay stage 512, the refresh system only introduces time delays when the refresh system is on schedule. If the memory refresh system falls behind, it will always attempt to refresh the skipped memory bank.

Note that the size of the Y cycle wide sliding window of Y contiguous memory cycles and the minimum number of reserved refresh cycles X that the memory user make available in every Y memory cycle window may vary for each different memory system depending on the refresh rates, the memory technology used, and other factors.

Advanced Round Robin Refresh with Multiple Concurrent Memory Users

Dual concurrent refresh systems can be implemented within multi-bank memory systems because while a memory user is accessing one memory bank, the memory refresh system can independently and concurrently refresh any of the other memory banks of the multi-bank memory system. The ability to independently and concurrently access different memory banks can also be used to implement additional concurrent memory access operations (memory reads and writes) to different memory banks. As long as each additional concurrent memory access is directed at a different memory bank, the memory controller of a multi-bank memory system may handle more than one concurrent memory access operation. Details on implementing a multi-bank memory system that can handle concurrent memory operations are disclosed in the U.S. patent application entitled "System And Method For Storing Data In A Virtualized High Speed Memory System" having Ser. No. 12/584,645 and filed on Sep. 8, 2009 and is hereby incorporated by reference.

When there is more than one memory access operation occurring at the same time in a multi-bank memory system then all of the different concurrent memory access operations can block the memory refresh circuitry. In order to prevent memory access operations from being stalled, the memory refresh system must work around all of the different concurrent memory access operations when refreshing memory rows. The operation of an advanced round robin system for a memory system that can perform two simultaneous memory access operations (reads or writes) is disclosed with reference to FIGS. 6, 7A, and 7B. Note that although two simultaneous memory access operations are disclosed in the example of FIGS. 6, 7A, and 7B, the same principles apply to memory systems that allow for 3, 4, or higher numbers of simultaneous memory access operations.

Figure 6:
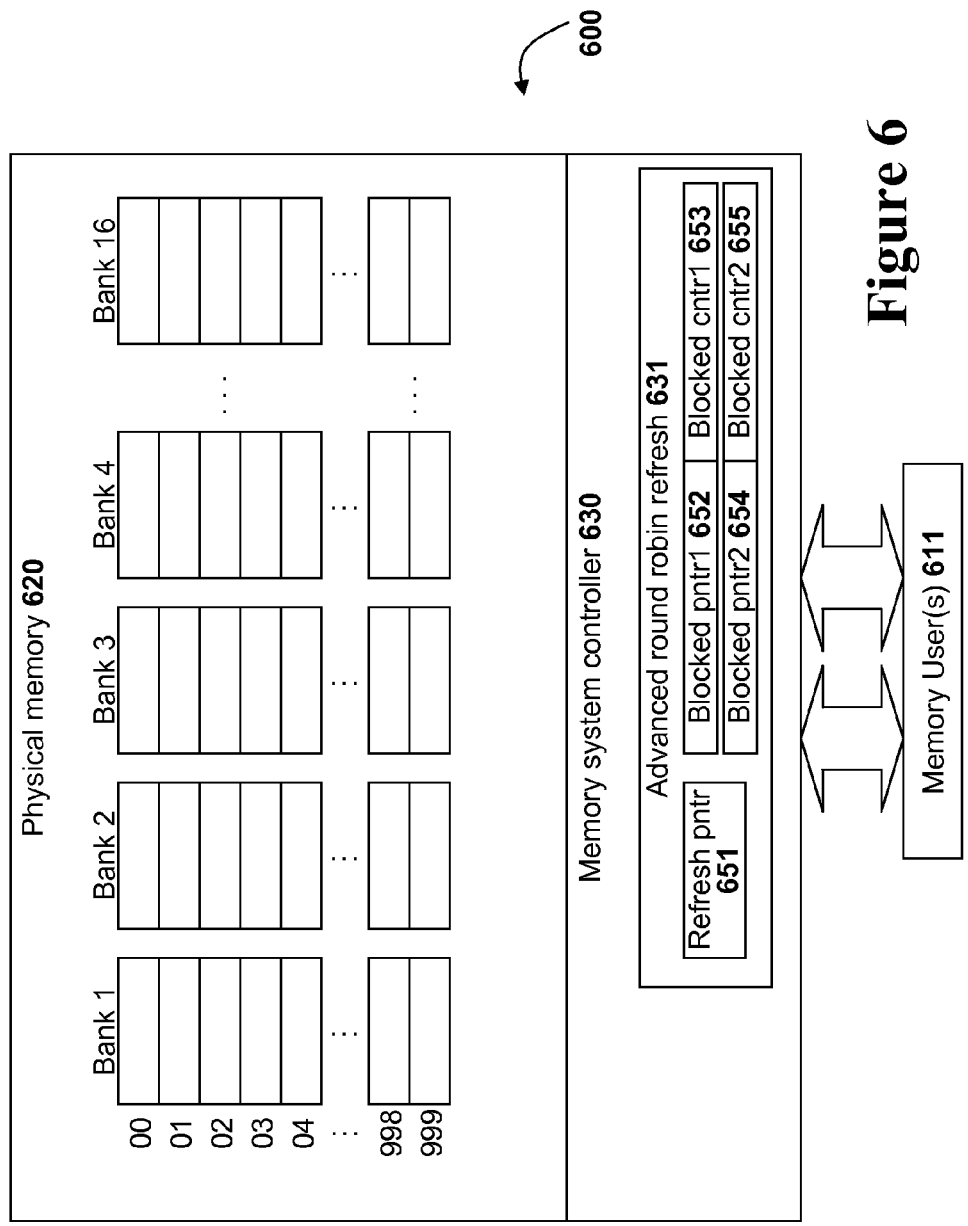
FIG. 6 illustrates a block diagram of a dynamic memory system that that can handle two concurrent memory accesses and a memory refresh that uses an advanced round robin refresh system.

Referring to FIG. 6, the advanced round robin refresh system 631 is generally similar to the advanced round robin refresh system 431 except that the advanced round robin refresh system 631 now has two sets of a blocked bank pointers and counters. There are two sets of pointers and counters since the two different memory accesses can block two different memory banks from being refreshed according to normal schedule. Thus, the advanced round robin refresh system 631 includes blocked bank pointer 1 452 with corresponding blocked bank counter 1 453 and blocked bank pointer 2 454 with corresponding blocked bank counter 2 455 to keep track of which memory banks have been skipped during a refresh pass.

In general, the system of FIG. 6 operates by prioritizing the refresh any 'skipped' memory banks. If there are no skipped memory banks then the refresh system works in a normal round-robin fashion. When a memory access operation blocks a scheduled memory refresh to a bank, then the memory refresh system notes the details about that skipped memory bank in a blocked bank pointer (452 or 454) and its associated blocked bank counter (453 or 455). In all subsequent memory refresh operations, the refresh system always first attempts to refresh the skipped memory banks before refreshing normally scheduled memory banks The flow diagram of FIGS. 7A and 7B discloses the operation of one specific implementation of an advanced round robin refresh system 631 for a memory system 600 that can handle two concurrent memory accesses. The operation is more complex than the system of FIG. 5 since two sets of blocked bank pointers and counters must be handled but the overall operation is basically similar. Additional sets of blocked bank pointers and counters can be added for memory systems that can handle 3, 4, or more concurrent memory access operations.

Figure 7A:
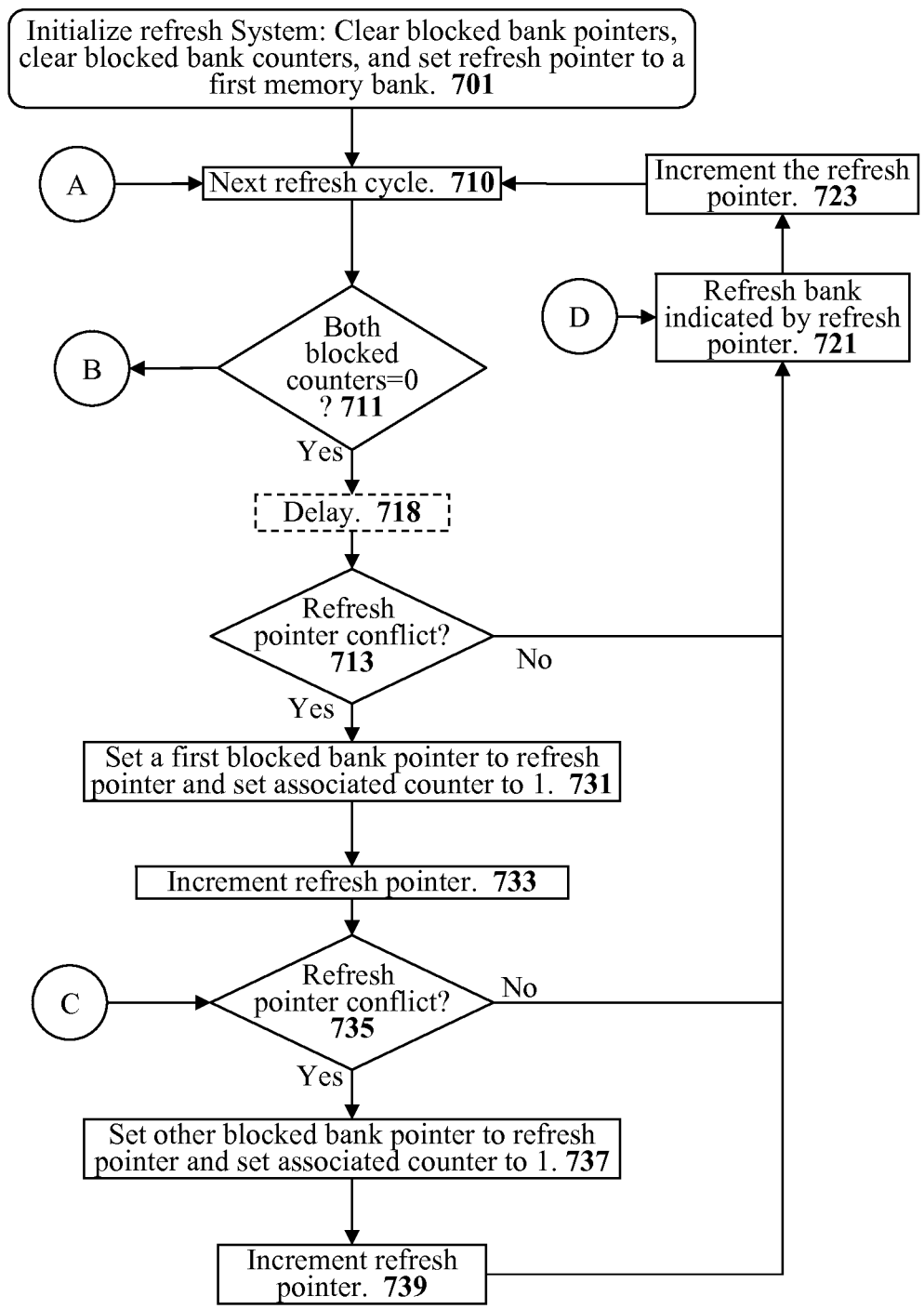
FIG. 7A illustrates a first part of a flow diagram describing the operation of an advanced round robin refresh system for the dynamic memory system of FIG. 4.

Referring to FIG. 7A, upon start-up the memory refresh system sets all of the pointers and counters to initial values during initialization stage 701. The memory refresh system 631 then enters a loop to handle refreshing memory rows. Referring to the embodiment of FIG. 7A, the main refresh loop when there are no blocked memory banks passes through stages 710, 711, 718, 713, 721, and 723. As described in the corresponding stages in FIG. 5, those stages ensure that there are currently no memory banks that have been skipped (stage 711), an optional delay state 712, ensure than the memory bank scheduled to be refreshed is not currently blocked (stage 713), then refresh the memory bank pointed to by the refresh pointer (stage 721), and increment the refresh pointer for the next refresh operation (stage 723).

Referring back to stage 713, when the memory bank pointed to by the refresh pointer 651 is eventually blocked by a memory access operation (that is given higher priority) then the refresh system proceeds to stage 731 to handle the conflict. The conflict is handled by temporarily skipping that memory bank. Specifically, at stage 731, the memory system sets one of the blocked bank pointers (652 or 654) and its corresponding blocked bank counter (653 or 655) to indicate that a memory bank has been skipped. The refresh system then increments the refresh pointer 651 at stage 733 to try to refresh the next memory bank. The refresh system 631 will then try to refresh that next memory bank by first testing if that next memory bank is blocked at stage 735. If that memory bank is not blocked then the refresh system 631 refreshes that next memory bank at stage 721, increments the refresh pointer at stage 723, and proceeds to the next cycle at stage 710.

However, when two consecutive memory banks are blocked by memory accesses, the refresh system 631 proceeds from stage 735 to stage 737 where the refresh system 631 sets the other blocked bank pointer to the current refresh pointer value and sets its corresponding blocked bank counter. The refresh system 631 then again increments the refresh pointer at stage 739, proceeds to refresh the next memory bank at stage 721, increments the refresh pointer yet again at stage 723, and proceeds to the next refresh cycle at stage 710. Note that the refresh pointer was incremented three times in this scenario, twice to advance past memory banks blocked by memory accesses and once more after refreshing a memory bank.

Figure 7B:
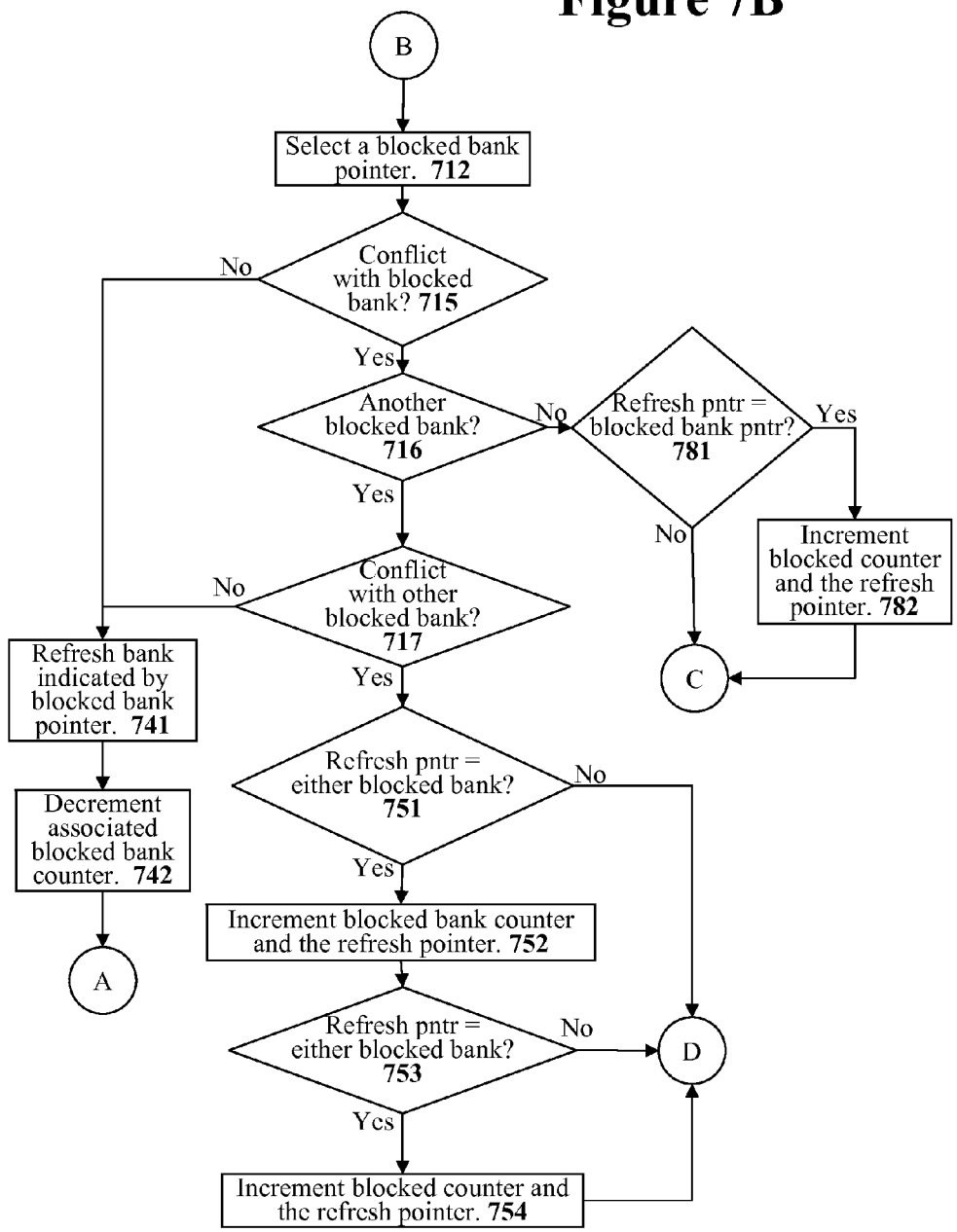
FIG. 7B illustrates a second part of a flow diagram describing the operation of an advanced round robin refresh system for the dynamic memory system of FIG. 4.

Referring back to the start of a memory refresh cycle at stage 711, if at least one of the blocked bank counters is not zero then the refresh system 631 proceeds to stage 712 of FIG. 7B to attempt to refresh a memory bank that has been skipped since the refresh system gives priority to refreshing skipped memory banks. At stage 712, the refresh system 631 selects one of the blocked bank pointers to select a memory bank that it will attempt to refresh. If only one of the blocked bank counters is non zero then obviously the refresh system 631 selects the blocked bank pointer associated with the non zero blocked bank counter. However, if there are two memory banks that have been skipped (both blocked bank counters 653 and 655 are non zero) then the memory refresh system 631 must select which the two skipped memory banks to attempt to refresh. Various selection systems include selecting the blocked bank pointer having the greater blocked bank counter value, selecting the blocked bank pointer that points to the memory bank that was blocked first, always picking one arbitrary blocked bank pointer first, alternating between the blocked bank pointers on a round robin basis, randomly selecting a blocked bank pointer, etc. In one implemented embodiment, the system selects the blocked bank pointer that points to the memory bank that was blocked first to prevent starvation.

After selecting a blocked bank pointer, the refresh system tests to see if that skipped memory bank is currently blocked by a memory access at stage 715. If that memory bank is not currently blocked by a memory access operation, then the refresh system 631 can refresh that skipped memory bank at stage 741, decrement the associated blocked bank counter at stage 742, and proceed to the next memory refresh cycle at stage 710. However, if the memory bank is still blocked by a memory access (at stage 715), then the refresh system 631 proceeds to stage 716.

At stage 716, the refresh system 631 first determines if there is another skipped memory bank that is behind on its refresh schedule by testing the other blocked bank counter. If the other blocked bank counter is zero (meaning that there was only one skipped memory bank) then the refresh system 631 proceeds to stage 781 where the refresh system tests to see if the refresh pointer points to the same skipped memory bank tested in stage 715. If this is true, then refresh system has gone through an entire refresh round and has returned to the same blocked memory bank again. Thus, if the refresh pointer points and the blocked memory bank pointer are equal then the refresh system increments the block bank counter and increments the refresh pointer at stage 782. After stage 782 (or determining that the refresh pointer points does not equal the blocked memory bank pointer, the refresh system proceeds to stage 735 (on FIG. 7A) to attempt to refresh the memory bank next scheduled for refresh by consulting the refresh pointer 651. At stage 735, the refresh system first tests to see if that next memory bank is currently blocked by a current memory access operation. If that memory bank is not blocked, then the memory refresh system will refresh that memory bank in the normal manner with stages 721 and 723. If that memory bank is currently blocked by a memory access then the memory refresh system 631 will set the currently unused blocked bank pointer to the current pointer value and set the corresponding blocked bank counter to 1 at stage 737 such that now there are two memory banks that have been skipped. The refresh system 631 then increments the refresh pointer at stage 739 and refreshes that next memory bank in the normal manner with stages 721 and 723.

Referring back to stage 716 on FIG. 7B, if there is a second skipped memory bank then the refresh system 631 will proceed to stage 717 to attempt to refresh that other skipped memory bank. First, at stage 717, the refresh system 631 will test if that other skipped memory bank is blocked by a current memory access operation. If that second skipped memory bank is not currently blocked by a memory access operation, then the refresh system 631 can refresh that second skipped memory bank at stage 741, decrement the associated blocked bank counter at stage 742, and proceed to the next memory cycle at stage 710.

Referring back to stage 717, if both skipped memory banks are currently busy handling memory accesses then the refresh system 631 proceeds to 751 to refresh the memory bank that the refresh pointer is pointing at. At stage 751, the refresh system 631 tests to see if the refresh pointer 651 is pointing at one of the memory banks represented in one of the blocked bank pointers. If the refresh pointer 651 is not pointing to one of the memory banks represented in one of the blocked bank pointers then the refresh system 631 proceeds back to stage 721 on FIG. 7A to refresh that next memory bank scheduled for refresh in the normal manner with stages 721 and 723.

However, if at stage 751, the refresh system 631 discovers that the refresh pointer 651 is pointing to one of the memory banks represented in one of the blocked bank pointers (652 or 654) then the refresh system 631 has made a pass through all the memory banks and has returned to refresh one of the blocked memory banks. Therefore, the refresh system 631 increments the corresponding blocked counter for that blocked bank pointer at stage 752. The refresh system 631 also increments the refresh pointer 651 and tests the next memory bank at stage 753. Specifically, at stage 753, the refresh system again tests to see if the refresh pointer 651 is pointing at one of the memory banks represented in either one of the blocked bank pointers. If it is not a skipped memory bank then the refresh system 631 can refresh that next memory bank in the normal manner with stages 721 and 723. Otherwise, the refresh system 631 increments the corresponding blocked counter for that blocked bank pointer at stage 754, increments the refresh pointer 651 at stage 754, and then refreshes the memory bank pointed to by the refresh pointer 651 in the normal manner with stages 721 and 723.

Reserved Refresh Cycles for Multi-Memory Access System

In a memory system with the advanced round robin refresh system as disclosed in FIGS. 6, 7A, and 7B, the advanced round robin refresh system refreshes memory rows of in one memory bank of the memory system while avoiding two simultaneous memory access operations occurring in other memory banks of the memory system. However, once again certain adversarial memory access patterns could potentially block the advanced round robin refresh system 431 from easily completing the duty of refreshing every memory cell in the memory system within the memory cell retention time period. Therefore, the memory system should be given a specified number of reserved refresh cycles during each cell retention time period in order to refresh memory banks that continually blocked by memory access operations.

Again, the minimum number of reserved refresh cycles that should be provided is dependent upon several parameters of the memory system. Specifically, the number of reserved refresh cycles will be a function of a number of memory banks B in the memory system, a number of rows R in each memory bank, the number of memory cycles W during each memory cell retention time period, and the number of read/write memory accesses m that will be occurring concurrently. The required minimum number of reserved refresh cycles can be expressed as X reserved refresh cycles in every Y continuous memory cycles. Using mathematical proofs, a minimum ratio of total memory cycles (Y) to reserved refresh cycles (X) has been determined. Specifically, in a system with the following assumptions:

1) A pattern of having X reserved refresh cycles in every Y cycles.
2) $1 \leq X \leq mR$ and $mR = aX + b$, where $0 \leq b \leq X-1$
3) $W \leq 2BR + (m-1)B$ Then a memory access pattern that has the following total-cycles to reserved-refresh cycles ratio (Y/X) will ensure that every row in every memory bank will be refreshed within the memory cell retention time period:

(i) If $b = 0$, let $X = sm + t$ where $1 \leq t \leq m$ then $$\frac{Y}{X} \leq \frac{W - (s+1)B - (mR-1) + X - t}{mR}$$

(i) If $b > 0$, let $b = sm + t$ where $1 \leq t \leq m$ then

-continued
$$\frac{Y}{X} \le \frac{W - (s+1)B - (mR-1) + X - t}{(a+1)X}$$

As long as the memory user includes reserved refresh cycles that comply with the above ratio, the advanced round robin refresh system will always refresh all of the rows in the memory system such that no data is lost. The requirements may be described in other forms. The following formulation discloses a number of cycles during the cell retention period that will be sufficient in order to for every row to be refreshed during the cell retention time period. In a system with the following assumptions:

1) A pattern of having X reserved refresh cycles in every Y cycles.

2) mR=aX+b, b=pm+q, and m=gX+h where $1 \le b \le X$, $1 \le q \le m$, and $1 \le h \le X$.

Then a memory system using the advanced round robin system which has at least W cycles during each cell retention time period will ensure that every row in every memory bank will be refreshed within the memory cell retention time period wherein:

$$W \ge \begin{cases} RB + (g+1)Y - X + \frac{B}{m}(h-1) + m\left[\frac{Y-X}{B-m}\right] + m - 1 & \text{if } mY \le BX \\ (a+1)Y + (p+1)B - X + \frac{B}{m}(q-1) + m(X+1) & \text{if } mY > BX \end{cases}$$

The above formulation can be rearranged to solve for the X and Y values assuming the memory hardware is sufficient to construct a desired memory system.

Implementation Variations

The advanced round robin refresh system disclosed in FIGS. 6, 7A, and 7B is designed for a dynamic memory system that can perform two concurrent memory accesses in two different memory banks. However, the same teachings can be applied to dynamic memory systems that can perform three, four, or even greater numbers of concurrent memory accesses. For each concurrent memory access that can be performed, the advanced round robin refresh system uses blocked bank pointer and a blocked bank counter to keep track of skipped memory banks. Similarly, the operational method (as disclosed in FIGS. 7A and 7B) needs to be extended to handle the additional blocked bank pointers and a blocked bank counters.

When there are a large number of memory banks in a memory system or several memory accesses can occur concurrently (thus blocking more refresh attempts) then more than one refresh circuit may be used to concurrently refresh multiple memory banks. In such a system, the refresh system would not only need to avoid conflicts with memory accesses but would need to avoid conflicts with other refresh systems Advanced Round Robin Refresh with Counter Limits In the concurrent refresh systems disclosed in the earlier sections, the blocked bank counter is allowed to continue increasing indefinitely. However, as long as the memory users follow the rules for a minimum number of X reserved refresh clock cycles during a specified sliding window of Y cycles, the refresh system will be able to refresh the blocked memory banks during those reserved clock cycles and prevent the blocked bank counter values from increasing indefinitely. In an alternate embodiment disclosed in this section, the memory refresh system may impose strict limits on how many times a memory bank may be skipped over.

Figure 8:
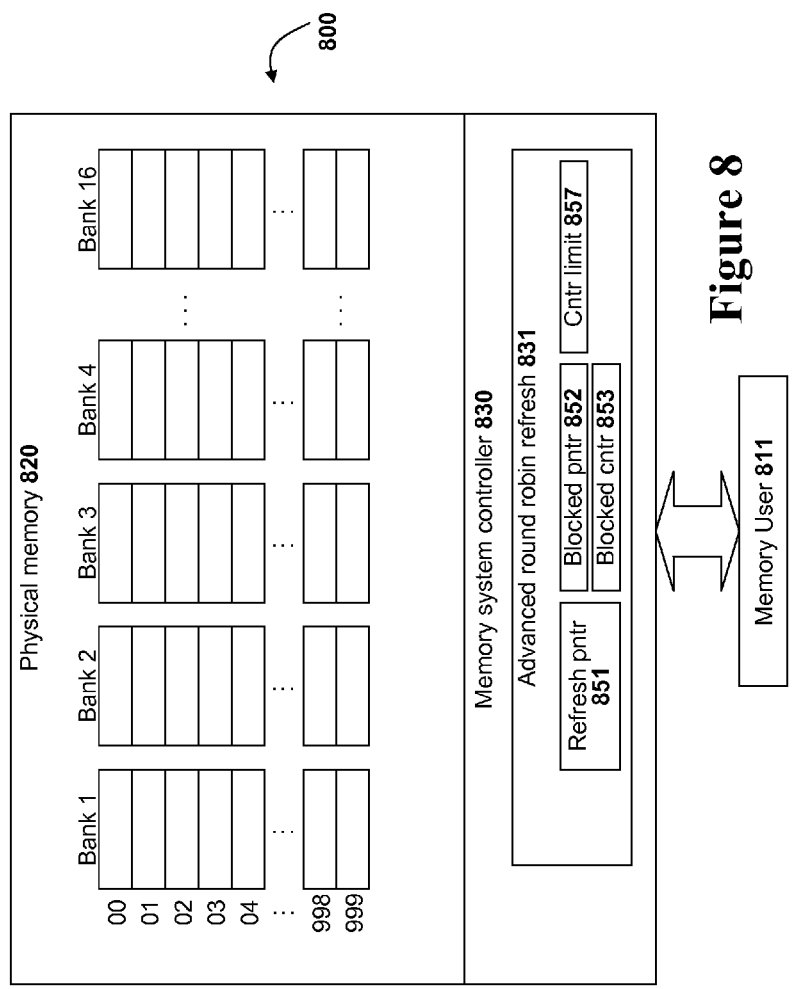
FIG. 8 illustrates a block diagram of the dynamic memory system of FIG. 4 wherein there is a counter limit that limits how high the blocked counter can grow.

FIG. 8 illustrates an advanced round robin refresh system 831 operates using a refresh pointer 851, a blocked bank pointer 852, a blocked bank counter 853, and a blocked counter limit 857. As with the previous systems, the refresh pointer 851 points to the next memory bank that the advanced round robin refresh system 831 plans on refreshing in a round-robin rotation manner. Similarly, the blocked bank pointer 852 points to a memory bank has been skipped and the related blocked bank counter 853 stores how many times that skipped memory bank has skipped a scheduled refresh. The advanced round robin refresh system 831 of FIG. 8 adds a counter limit 857 that limits how large the blocked bank counter 853 is allowed to grow. The counter limit 857 may be a hard coded value or it may be programmable depending on the specific implementation.

The advanced round robin refresh system 831 operates differently from the advanced round robin refresh system disclosed in the earlier sections by using the counter limit 857. Specifically, when the blocked bank counter 853 reaches maximum counter value specified in the counter limit 857 then the advanced round robin refresh system 831 will no longer advance the refresh pointer 851. Instead, the system continuously attempts refresh the memory bank that has reached the counter limit 857.

Figure 9A:
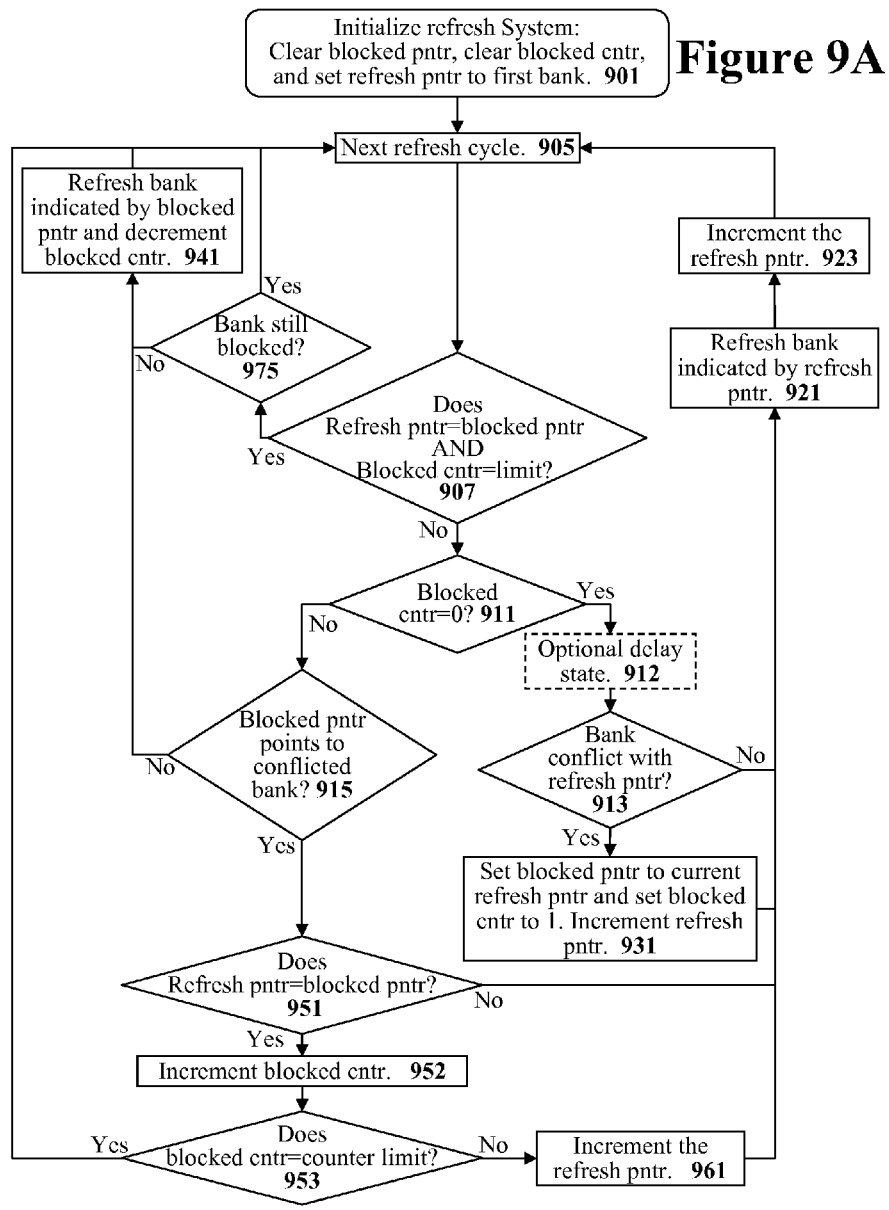
FIG. 9A illustrates a flow diagram describing the operation of a first embodiment of an advanced round robin refresh system in FIG. 8 with a counter limit.

FIG. 9A describes in detail how the advanced round robin refresh system 831 with a counter limit 857 operates. Note that the flow diagram of FIG. 9A is for explanatory purposes and that an actual implementation may not operate exactly as disclosed in FIG. 9A. For example, not all implementations will include these steps and some steps may be done in different orders in different implementations.

Referring to FIG. 9A, when the memory system first receives power, the advanced round robin refresh system 831 initializes itself at stage 901. The advanced round robin refresh system 831 clears the blocked bank pointer 852 and the blocked bank counter 853 since no memory banks are blocked initially. The refresh pointer 851 is set to point to a first memory bank to be refreshed. The counter limit 857 is set using programmed value or a hard-coded value. The advanced round robin refresh system 831 then advances through stage 905 to the next memory refresh cycle.

In the advanced round robin refresh system 831 the system first determines if the advanced round robin refresh system 831 is stuck at blocked memory bank that has reached the counter limit 857. Specifically, at stage 907 the advanced round robin refresh system 831 determines if the refresh pointer 851 is equal to the blocked bank pointer 852 and the blocked bank counter 853 equals the counter limit 857. In such a situation where the refresh pointer 851 is pointing to a skipped memory bank that has reached the counter limit 857, the advanced round robin refresh system 831 only checks if that blocked memory bank is still blocked by a memory access at stage 975. If that blocked memory bank is still blocked the refresh system proceeds from stage 975 back to stage 905 to the next refresh cycle. Referring back to stage 975, if that skipped memory bank is now finally available for a refresh, the advanced round robin refresh system 831 proceeds to stage 941 where the refresh system 831 refreshes that skipped memory bank and decrements the blocked bank counter 853 before returning back to stage 905 for the next refresh cycle.

Referring back to stage 907, if the advanced round robin refresh system 831 is not stuck at a skipped memory bank that has reached the counter limit 857 then the refresh system proceeds to stage 911. As with the previously described refresh systems, the refresh system 831 tests if the blocked bank counter 853 is zero at stage 911. If the blocked bank counter 853 is zero (there are no skipped memory banks) then the advanced round robin refresh system 831 can proceed through stages 912, 913, 921, and 923 as the normal round robin cycle that will occur as long as there are not any memory bank conflicts. When memory bank conflict occurs, the refresh system 831 will proceed through stage 931 where the advanced round robin refresh system 831 sets the blocked bank pointer 852 to the current value of the refresh pointer to indicate which memory bank has been blocked and sets the blocked bank counter 853 to 1 since this is the first time the blocked memory bank is being skipped.

Referring back to stage 911, if there was memory bank that had skipped a refresh opportunity (the blocked bank counter did not equal zero) then the advanced round robin refresh system 831 advances to stage 915 to determine if that skipped memory bank can now be refreshed. Thus, the refresh system 831 tests to see if that skipped memory bank is still blocked by a memory access at stage 915. If that memory bank is no longer blocked by a conflicting memory access then the advanced round robin refresh system 831 can refresh that memory bank. Thus, the refresh system 831 may proceed to stage 941 to refresh that skipped memory bank (using the blocked bank pointer 852) and decrements the blocked bank counter 853. The advanced round robin refresh system 831 then proceeds to stage 905 to handle the next refresh cycle.

Referring back to stage 915, if the skipped memory bank is still blocked by a memory access then the advanced round robin refresh system 831 proceeds to stage 951 to refresh the next memory bank in the round-robin schedule as indicated by the refresh pointer 851. At stage 951, the advanced round robin refresh system 831 first tests to see if the refresh pointer 851 equals the blocked bank pointer 852. If the two values are not equal then the advanced round robin refresh system 831 can proceed with a normal refresh cycle by refreshing the memory bank pointed to by the refresh pointer 851 at stage 921, incrementing the refresh pointer 851 at stage 923, and proceeding to the next refresh cycle at stage 905.

Referring back to stage 951, if the refresh pointer 851 equals the blocked bank pointer 852 at stage 951 then the advanced round robin refresh system 831 has proceeded through an entire round of refreshing all the memory banks and has returned to the blocked memory bank which continues to be blocked. Thus, the refresh system increments the blocked counter 853 at stage 952 Next, the refresh system proceeds to stage 953 where the advanced round robin refresh system 831 tests to see if the blocked bank counter 853 has reached the counter limit 857. If stage 953 determines that the counter limit 857 has been reached, the advanced round robin refresh system 831 will do nothing until that blocked memory bank which has reached the counter limit 857 can be refreshed. Thus, the refresh system proceeds from stage 953 to the next refresh cycle 905. The refresh system will then loop through stages 907, 975, and 905 until the blocked memory bank is no longer blocked by a memory access. However, if at stage 953 the blocked bank counter 853 has not yet reached the counter limit 857 then the refresh system proceeds to stage 961 where it increments the refresh pointer 851 and proceeds to stage 921 where it refreshes the that next memory bank.

Figure 10:
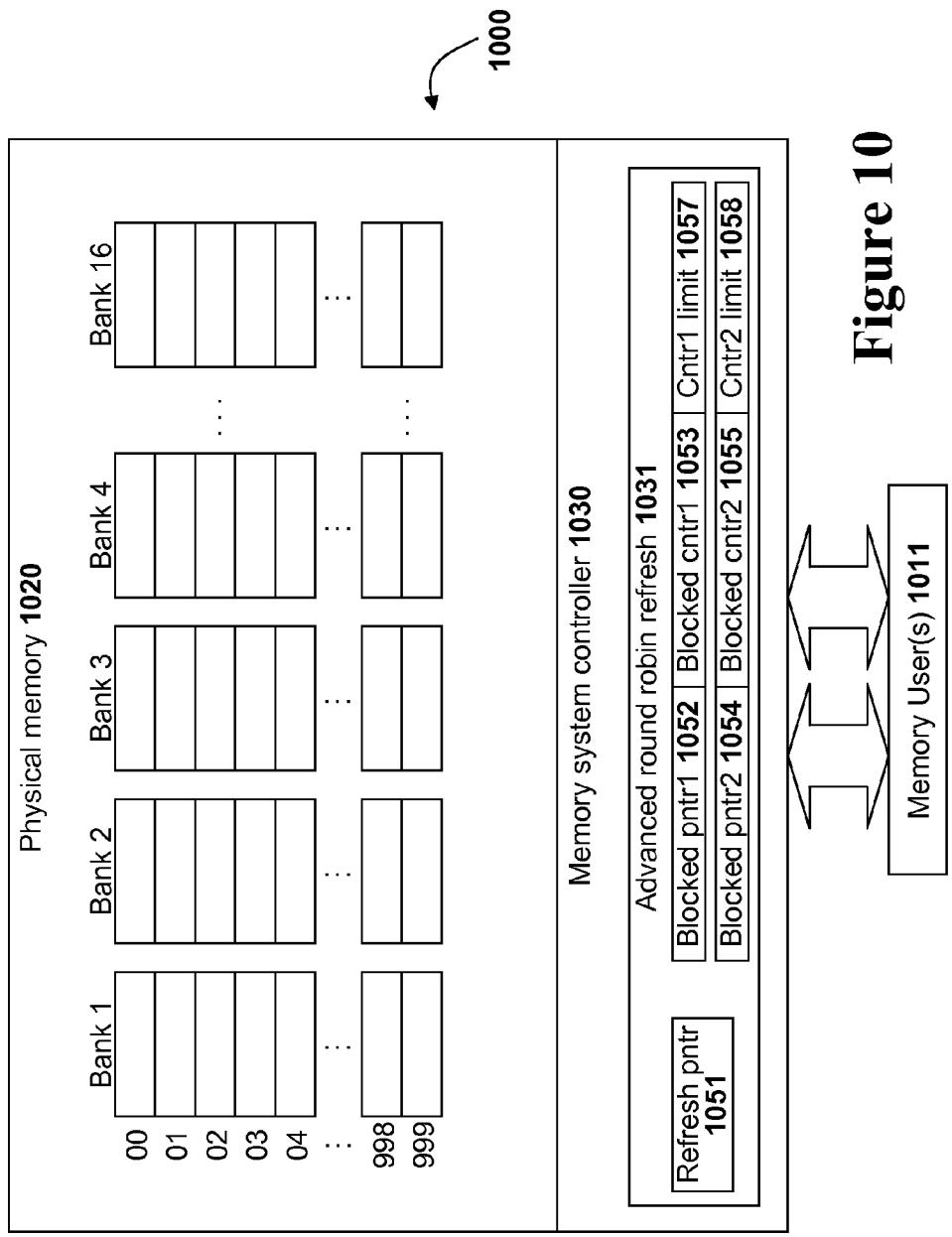
FIG. 10 illustrates a dynamic memory system that handles two simultaneous memory accesses and has two block bank counters that are each limited by counter limits.

FIG. 9A illustrated the operation of a memory with counter limits wherein there is only one memory reader. However, counter limits may also be used when there is more then one memory reader. FIG. 10 illustrates a memory system 1000 that handles two simultaneous memory accesses. In the embodiment of FIG. 10, the advanced round robin memory refresh system 1031 has two counter limits 1057 and 1058 that are associated with blocked bank counters 1053 and 1055, respectively. Note that the two counter limits 1057 and 1058 may have different limits. The operation of the advanced round robin memory refresh system 1031 having two counter limits 1057 and 1058 would be a operation of the two memory access refresh system disclosed in FIGS. 7A and 7B combined with the counter limit checking aspects disclosed in FIG. 9A.

Advanced Round Robin Refresh with Refresh Pointer Adjustments

Figure 9B:
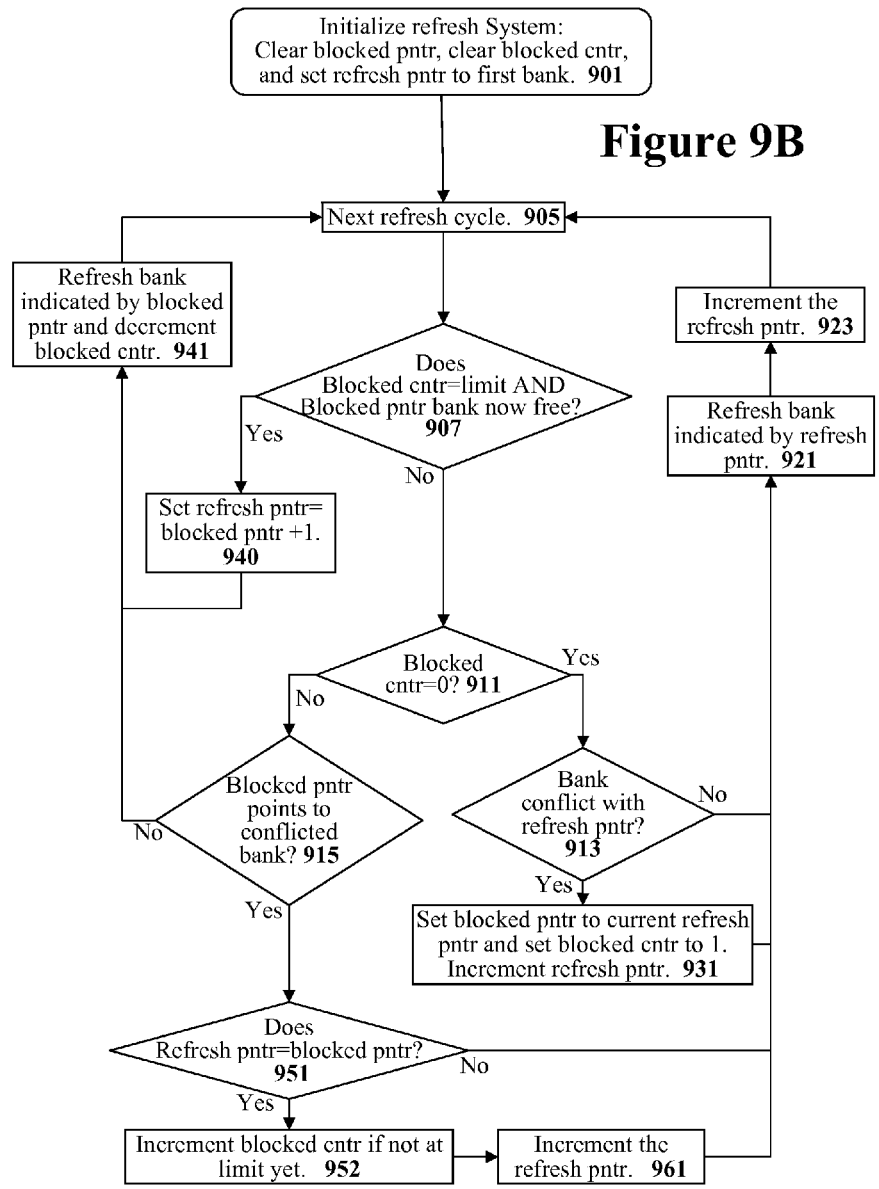
FIG. 9B illustrates a flow diagram describing the operation of an alternate embodiment that adjusts the refresh pointer each time a skipped memory bank is refreshed.

In the refresh system disclosed with reference to FIG. 9A, the refresh pointer remained at a blocked bank until the bank became free. However, alternate embodiments may adjust the manner in which refresh pointer behaves. FIG. 9B illustrates a flow diagram describing the operation of an alternate embodiment that continues to refresh other memory banks when the maximum is hit but will immediately refresh the blocked bank when it becomes available for refresh.

FIG. 9B illustrates the operation of memory refresh system that operates in a similar manner as the refresh system with a counter limit that was disclosed with reference to FIG. 8 and FIG. 9A. For example, the refresh system operates in the same manner when the refresh system uses the same main operational loop through stages 913, 921, and 923 is the same when there are no skipped memory banks. However, the operation of the memory refresh system disclosed with reference to FIG. 9B differs when there is a memory bank is that has been skipped.

Initially, after refresh cycle 905 begins, the refresh system first determines if blocked counter limit has been reached and that skipped bank is available for refresh at stage 907. When this occurs, the refresh system sets the refresh pointer is set to point at the memory bank after the skipped bank at stage 940 (wherein the memory refresh system sets the refresh pointer to the blocked bank pointer plus one). The refresh system then proceeds to refresh the skipped memory bank (as indicated by the blocked bank pointer) and decrement the blocked bank counter at stage 941 before advancing to the next refresh cycle through stage 905. In this manner, the advanced round robin refresh system will resume refreshing memory banks starting with the memory bank that follows the memory bank that had reached the limit.

If the blocked counter was not at the limit at stage 907 then the refresh system proceeds to stage 911 where it checks if the there is a skipped memory bank. If there is no skipped memory bank, the system proceeds through main loop stages 913, 921, 923, and sometimes 931 (when bank is blocked). When there is a skipped memory bank, the refresh system first tests if that skipped memory bank can be refreshed by seeing if it is currently conflicted at stage 915. If the skipped memory bank is no longer conflicted then it will be refreshed at stage 941 and the system proceeds to the next refresh cycle 905.

If the skipped memory bank is still blocked at stage 915 then the refresh system tests to see if the refresh pointer is pointing to that skipped memory bank at stage 951. If the refresh pointer is not pointing that that skipped memory bank then the refresh system can proceed through steps 921 and 923 to refresh the memory bank pointed to by the refresh pointer. If the refresh pointer does point to the skipped (and still currently blocked) memory bank at stage 951 then the refresh system moves to stage 952 where the blocked counter is incremented if it is not at the limit yet. The refresh pointer is then advanced at stage 961 and the refresh system then proceeds through steps 921 and 923 to refresh the memory bank pointed to by the refresh pointer.

As described above, the refresh system of FIG. 9B will refresh a blocked memory bank that has hit the limit as soon as it is available. However, it will continue refreshing the other memory banks FIG. 9B illustrates just one possible alternative system for changing the refresh pointer behavior. Other types of adjustments are within scope of the disclosed dual concurrent refresh system.

Applicability to Other Dynamic Memory Environments

The memory refresh examples disclosed in this document have largely focused on implementations within embedded dynamic random access memory systems (eDRAM). However, the same advanced round-robin refresh system maybe used in other contexts where the contents of memory cells must be refreshed to prevent loss.

Traditional dynamic random access memory (DRAM) systems may be adapted to use the advanced round robin system disclosed in this document. Most traditional dynamic memory systems use dedicated memory controller circuits that handle memory requests and periodically issue refresh operations to the DRAM devices on a regular schedule. These refresh operations are all handled by the memory controller circuit and hidden from the memory user such as a microprocessor or microcontroller. However, by issuing refresh operations on a regular basis, the memory controllers reduce the ability of the memory system to quickly respond to bursts of memory requests.

A traditional DRAM memory controller may be modified to use the advanced round robin system disclosed in this document. The modified memory controller would operate by refreshing memory rows in memory devices that are not currently involved in memory access operations. As disclosed in the previous sections, a round robin system may be used to ensure every memory device is refreshed. Memory devices that are blocked from a scheduled refresh will be noted using a blocked device pointer and blocked device counter such that the memory controller will return to refresh skipped memory devices when those memory devices become available for refresh. If the memory controller determines that memory device is in danger of losing data then the memory controller may stall memory access operations in order to refresh that memory device.

One difference in handling traditional dynamic memory devices is that refresh operations may require two or more clock cycles instead of a single clock cycle. However, this can be handled by stalling memory access requests.

The preceding technical disclosure is intended to be illustrative, and not restrictive. For example, the above-described embodiments (or one or more aspects thereof) may be used in combination with each other. Other embodiments will be apparent to those of skill in the art upon reviewing the above description. The scope of the claims should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim is still deemed to fall within the scope of that claim. Moreover, in the following claims, the terms "first," "second," and "third," etc. are used merely as labels, and are not intended to impose numerical requirements on their objects.

The Abstract is provided to comply with 37 C.F.R. §1.72 (b), which requires that it allow the reader to quickly ascertain the nature of the technical disclosure. The abstract is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

We claim:

1. A dynamic digital memory system, said dynamic digital memory system comprising:
    a set of memory banks, each of said memory banks able to be accessed independent of the other memory banks in said set of memory banks, each of said memory banks comprising a plurality of memory rows; and
    a single memory refresh circuit coupled to the set of memory banks and shared by the set of memory banks to refresh all said set of memory banks, said single memory refresh circuit comprising:
        a refresh pointer for pointing to a next memory bank to be refreshed, said single memory refresh circuit skipping said next memory bank when a memory access is currently accessing said next memory bank and refreshing a subsequent memory bank after said next memory bank such that a memory refresh operation occurs every refresh cycle;
        a first blocked bank pointer for identifying a first blocked memory bank that has been skipped from a recent refresh attempt due to a memory access, and
        a first blocked bank counter associated with said first blocked bank pointer, said first blocked bank counter for storing a count of times said first blocked memory bank has been skipped for refresh;
        wherein said first blocked memory bank identified in said first blocked bank pointer is given priority for refresh over said next memory bank pointed to by said refresh pointer when said first blocked bank counter is not zero.

2. The dynamic digital memory system as set forth in claim 1 wherein said single memory refresh circuit further comprises a memory row pointer for each memory bank in said set of memory banks.

3. The dynamic digital memory system as set forth in claim 1 wherein said single memory refresh circuit decrements said first blocked bank counter upon refreshing said first memory bank identified by said first blocked bank pointer.

4. The dynamic digital memory system as set forth in claim 1 wherein said single memory refresh circuit increments said refresh pointer upon refreshing said next memory bank identified by said refresh pointer.

5. The dynamic digital memory system as set forth in claim 1 wherein said single memory refresh circuit further comprises
    a second blocked bank pointer for identifying a second blocked memory bank that has been blocked from a recent refresh attempt, and
    a second blocked bank counter associated with said second blocked bank pointer, said second blocked bank counter for storing a count of times said second blocked memory bank has been skipped for refresh;
    wherein said first blocked memory bank identified in said first blocked bank pointer is given priority over said next memory bank pointed to by said refresh pointer when said first blocked bank counter is not zero and said second blocked memory bank identified in said second blocked bank pointer is given priority over said next memory bank pointed to by said refresh pointer when said second blocked bank counter is not zero.

6. The dynamic digital memory system as set forth in claim 5 wherein when both said first blocked bank counter and said second blocked bank counter are non zero, said single memory refresh circuit determines the greater value of said first blocked bank counter and said second blocked bank counter and then attempts to refresh a memory bank associated with the greater value.

7. The dynamic digital memory system as set forth in claim 5 wherein when both said first blocked bank counter and said second blocked bank counter are non zero, said single memory refresh circuit attempts to refresh either said first blocked memory bank identified by said first blocked bank pointer or said second blocked memory bank identified by said second blocked bank pointer on a round robin basis.

8. The dynamic digital memory system as set forth in claim 5 wherein when both said first blocked bank counter and said second blocked bank counter are non zero, said single memory refresh circuit randomly selects either said first blocked memory bank identified by said first blocked bank pointer or said second blocked memory bank identified by said second blocked bank pointer for refresh.

9. The dynamic digital memory system as set forth in claim 5 wherein when both said first blocked bank counter and said second blocked bank counter are non zero, said single memory refresh circuit randomly selects either said first blocked memory bank identified by said first blocked bank pointer or said second blocked memory bank identified by said second blocked bank pointer depending on which was blocked earlier.

10. The dynamic digital memory system as set forth in claim 1 wherein said dynamic digital memory system comprises an embedded dynamic memory system.

11. A method of refreshing memory cells in a multi-bank dynamic memory system, said method comprising:
 refreshing memory banks in said multi-bank dynamic memory system in a nominal round-robin manner with a single memory refresh circuit coupled to the memory banks and shared by the memory banks;
 skipping a refresh of a first blocked memory bank when there is a conflict with a first memory access accessing said first blocked memory bank and refreshing a subsequent memory bank after said first blocked memory bank with said single memory refresh circuit such that a memory refresh operation occurs every refresh cycle;
 storing a count of times that said first blocked memory bank has been skipped for refresh; and
 immediately refreshing said first blocked memory bank when there is no longer a conflict with a memory access accessing said first blocked memory bank.

12. The method of refreshing memory cells in a multi-bank dynamic memory system as set forth in claim 11 wherein a first blocked bank pointer is used to identify said first blocked memory bank skipped during a refresh cycle.

13. The method of refreshing memory cells in a multi-bank dynamic memory system as set forth in claim 12 wherein a first blocked bank counter is used to identify a number of number of refresh cycles that have consecutively skipped said first blocked memory bank.

14. The method of refreshing memory cells in a multi-bank dynamic memory system as set forth in claim 13 further comprising:
 decrementing said first blocked bank counter upon refreshing said first blocked memory bank.

15. The method of refreshing memory cells in a multi-bank dynamic memory system as set forth in claim 11 wherein a refresh pointer is used to identify a next memory bank to refresh.

16. The method of refreshing memory cells in a multi-bank dynamic memory system as set forth in claim 15 further comprising incrementing said refresh pointer after refreshing a next memory bank identified by said refresh pointer.

17. The method of refreshing memory cells in a multi-bank dynamic memory system as set forth in claim 15 further comprising
 skipping a refresh of a second blocked memory bank when there is a conflict with a second memory access accessing said second blocked memory bank; and
 immediately refreshing said first blocked memory bank or second blocked memory bank when there is no longer a conflict with accessing said first blocked memory bank or said second blocked memory block.

18. The method of refreshing memory cells in a multi-bank dynamic memory system as set forth in claim 17 wherein said method refreshes said first blocked memory bank or second blocked memory bank depending on which has been skipped the greater number of times.

19. The method of refreshing memory cells in a multi-bank dynamic memory system as set forth in claim 17 wherein said method refreshes said first blocked memory bank or second blocked memory bank on a random basis.

20. The method of refreshing memory cells in a multi-bank dynamic memory system as set forth in claim 17 wherein said method refreshes said first blocked memory bank or second blocked memory bank on a round robin basis.

21. The method of refreshing memory cells in a multi-bank dynamic memory system as set forth in claim 17 wherein said method refreshes said first blocked memory bank or second blocked memory bank depending on which was skipped earlier.

* * * * *